United States Patent
Camargo et al.

(10) Patent No.: US 10,529,885 B2
(45) Date of Patent: Jan. 7, 2020

(54) OPTICAL DEVICE AND METHOD FOR MANUFACTURING THE SAME

(71) Applicant: ASAHI KASEI MICRODEVICES CORPORATION, Tokyo (JP)

(72) Inventors: Edson Gomes Camargo, Tokyo (JP); Toshiaki Fukunaka, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 0 days.

(21) Appl. No.: 15/911,697

(22) Filed: Mar. 5, 2018

(65) Prior Publication Data

US 2018/0287005 A1    Oct. 4, 2018

(30) Foreign Application Priority Data

Mar. 31, 2017 (JP) .................. 2017-072210
Mar. 31, 2017 (JP) .................. 2017-072463
Nov. 22, 2017 (JP) .................. 2017-224702

(51) Int. Cl.
*H01L 21/56* (2006.01)
*H01L 31/12* (2006.01)
(Continued)

(52) U.S. Cl.
CPC .......... *H01L 31/12* (2013.01); *H01L 21/4803* (2013.01); *H01L 21/4846* (2013.01);
(Continued)

(58) Field of Classification Search
CPC ...................................................... H01L 21/56
See application file for complete search history.

(56) References Cited

U.S. PATENT DOCUMENTS 5,907,571 A * 5/1999 Ogino ................. H01S 5/02244
372/36
2008/0123198 A1   5/2008 Fujita
(Continued)

FOREIGN PATENT DOCUMENTS

JP      S57-089273 A    6/1982
JP      H05-063068 U    8/1993
(Continued)

OTHER PUBLICATIONS

EPO translation of Sasayana, JP2014-78548, published May 1, 2014.*

(Continued)

*Primary Examiner* — Peniel M Gumedzoe
*Assistant Examiner* — Christopher A Johnson
(74) *Attorney, Agent, or Firm* — Morgan, Lewis & Bockius LLP

(57) ABSTRACT

PROBLEM TO BE SOLVED: To reduce an influence on an optical device caused by stress variation on a resin sealing body due to an environmental change and similar change. SOLUTION: An optical device includes a substrate 11, a semiconductor lamination portion formed on the substrate 11 and configured to receive or emit a light, a protective layer 3 that has a shape to cover an entire surface of the semiconductor lamination portion, a mold resin 6 configured to seal the protective layer 3 and the substrate 11 excluding a surface of the substrate 11 on an opposite side of a surface on which the semiconductor lamination portion is formed. The light is entered or emitted from a side of the substrate 11, and the mold resin 6 includes a through hole 61 configured to pass through from a top surface of the mold resin 6 to the protective layer 3. A deformation of the mold resin 6 is reduced by the protective layer 3 and the through hole 61.

(Continued)

Then, stress variation acting on an active portion 12 including the semiconductor lamination portion can be reduced.

10 Claims, 18 Drawing Sheets

(51) Int. Cl.
    *H01L 27/14*     (2006.01)
    *H01L 27/15*     (2006.01)
    *H01L 33/52*     (2010.01)
    *H01L 21/48*     (2006.01)
    *H01L 31/0236*     (2006.01)
    *H01L 33/20*     (2010.01)
    *H01L 31/0216*     (2014.01)

(52) U.S. Cl.
    CPC .............. *H01L 27/14* (2013.01); *H01L 27/15* (2013.01); *H01L 31/0216* (2013.01); *H01L 31/02366* (2013.01); *H01L 33/20* (2013.01); *H01L 33/52* (2013.01)

(56) References Cited

U.S. PATENT DOCUMENTS

| | | | |
|---|---|---|---|
| 2008/0173884 A1 | 7/2008 | Chitnis et al. | |
| 2009/0059591 A1 | 3/2009 | Nakamura et al. | |
| 2009/0095967 A1* | 4/2009 | Masui | H01L 33/52 |
| | | | 257/98 |
| 2011/0266587 A1 | 11/2011 | Naruse et al. | |
| 2012/0104435 A1 | 5/2012 | Lee et al. | |
| 2014/0048834 A1 | 2/2014 | Sato et al. | |
| 2016/0133807 A1 | 5/2016 | Hwang | |

FOREIGN PATENT DOCUMENTS

| | | | |
|---|---|---|---|
| JP | 2001-127348 A | | 5/2001 |
| JP | 2002-314142 A | | 10/2002 |
| JP | 2002-324916 A | | 11/2002 |
| JP | 2006-201226 A | | 8/2006 |
| JP | 2006-294681 A | | 10/2006 |
| JP | 2006-324408 A | | 11/2006 |
| JP | 2010-517289 A | | 5/2010 |
| JP | 2011-205068 A | | 10/2011 |
| JP | 2012-146826 A | | 8/2012 |
| JP | 2013-201347 A | | 10/2013 |
| JP | 2014078548 A | * | 5/2014 |
| JP | 2015-201657 A | | 11/2015 |
| JP | 2016-092021 A | | 5/2016 |
| JP | 6006602 B2 | | 9/2016 |
| JP | 2016-189488 A | | 11/2016 |
| WO | 2012/147608 A1 | | 11/2012 |

OTHER PUBLICATIONS

Decision to Grant a Patent dated Jan. 15, 2018 in counterpart Japanese Patent Application No. 2017-224702.

* cited by examiner

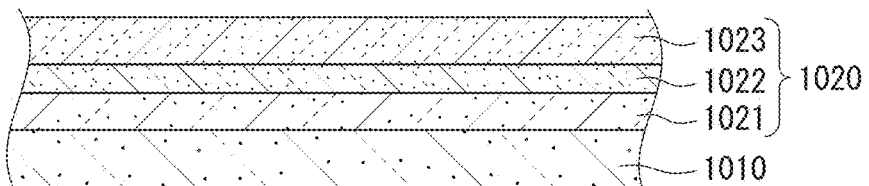
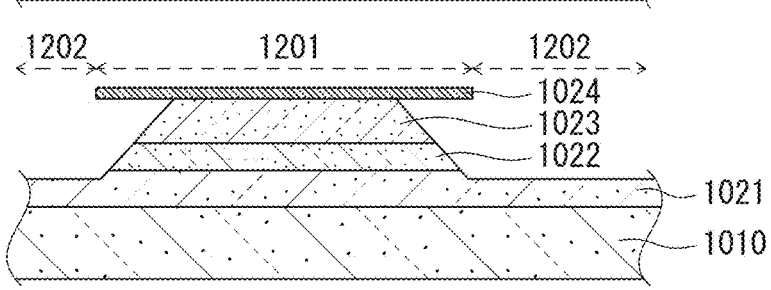
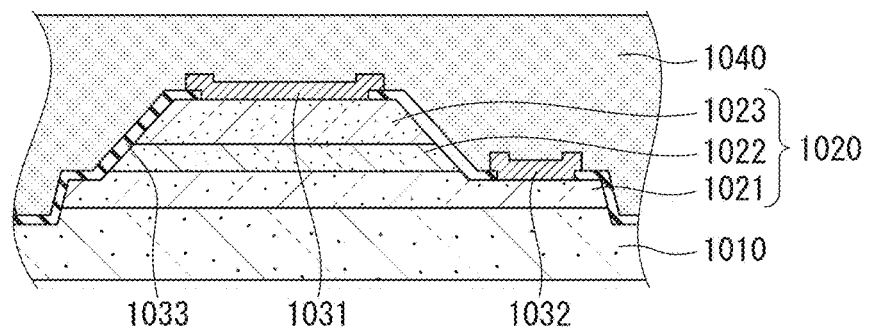
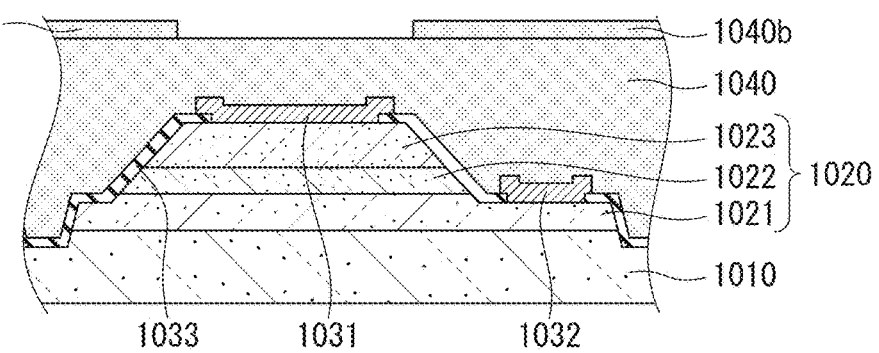
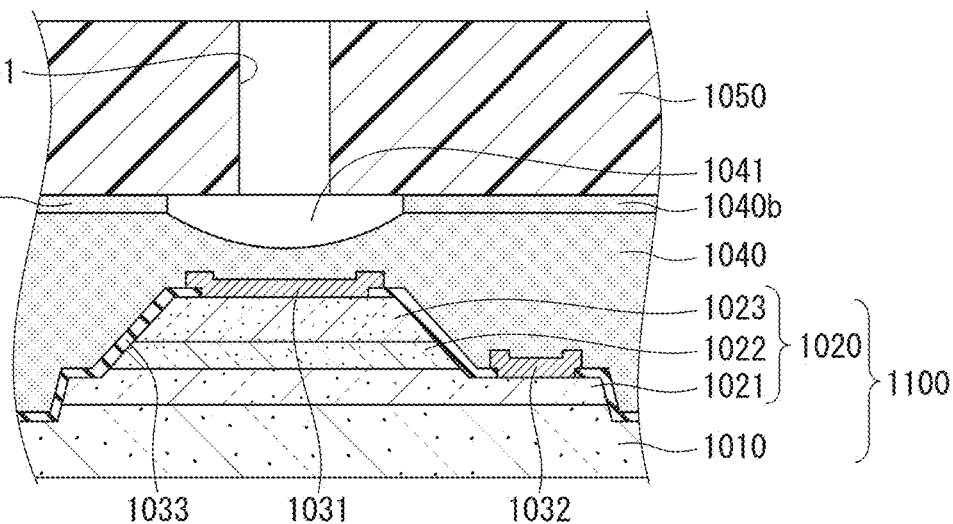

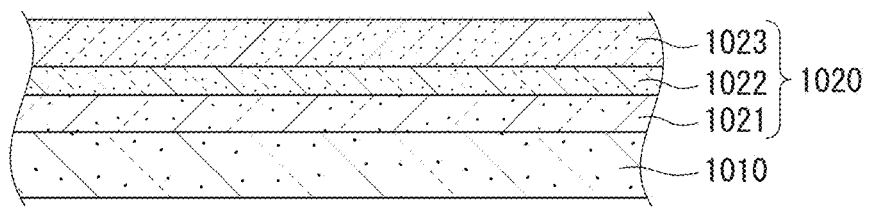
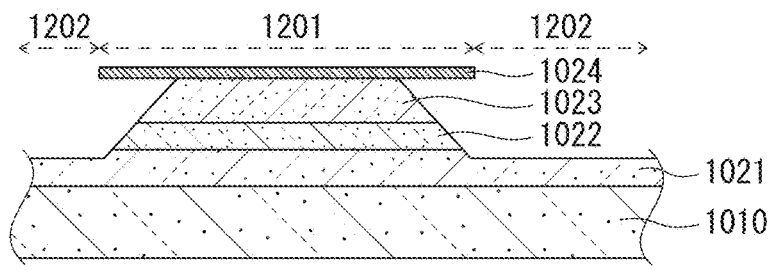
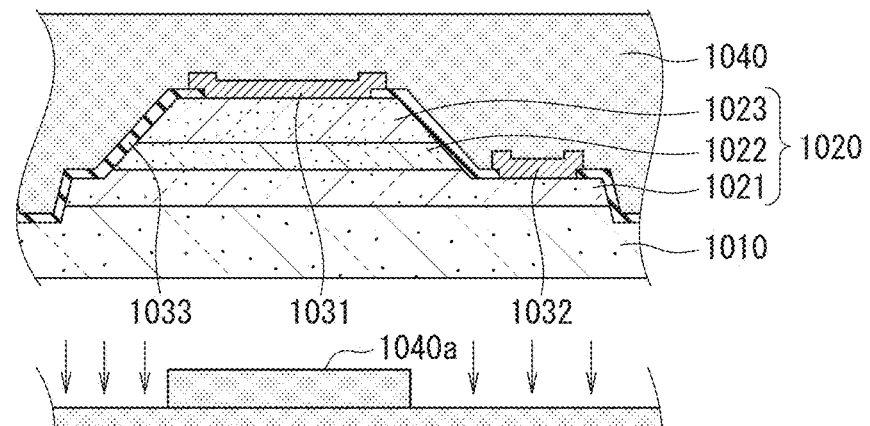
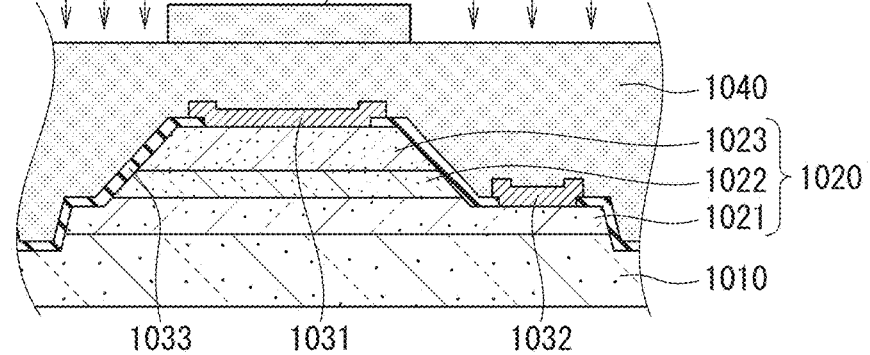
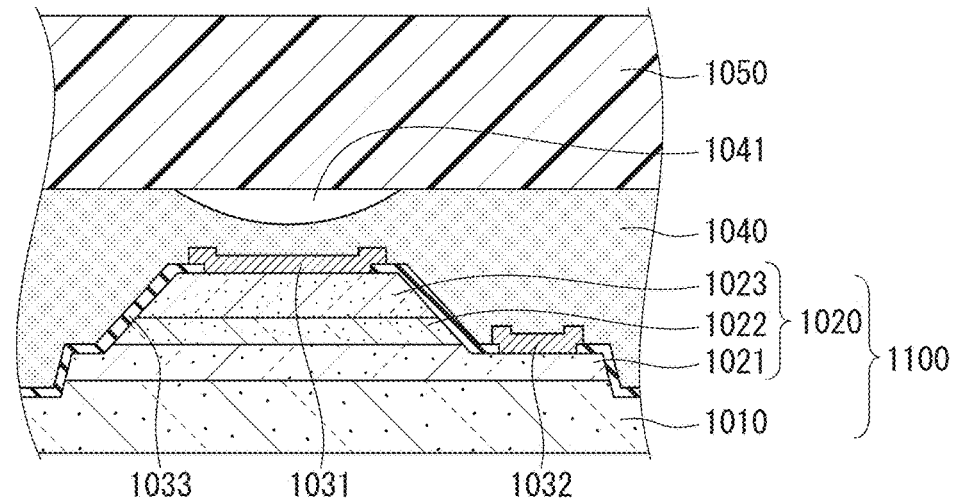

OPTICAL DEVICE AND METHOD FOR MANUFACTURING THE SAME

TECHNICAL FIELD

The present invention relates to an optical device, and more specifically, relates to an optical device such as an optical sensor or a light emitting device that has a sealing structure sealed by a resin-molded package.

BACKGROUND ART

Recently, a light emitting element having a high luminous efficiency and a photoelectric conversion element having a high signal-noise ratio (SNR) have been developed to meet various needs. These devices have been combined to develop an advanced sensor module. For one example, there has been a gas sensor that employs a non-dispersive infrared (NDIR) method. The conventional gas sensor of the NDIR method has been used including a tungsten lamp as an infrared light source and a thermopile as a light receiving portion.

However, for achieving downsizing and low power consumption, a configuration where a Light Emitting Diode (LED) is employed as a light source and a quantum type infrared device is employed as a light receiving portion has been becoming a future standard structure of the gas sensor of the NDIR method. Higher sensitivity and higher SNR of the light receiving portion and higher luminous efficiency of a light emitting portion is achieved by using, for example, a narrow gap compound semiconductor material in Groups III-V as the light receiving portion and the light emitting portion.

An optical device such as the quantum type infrared device and the LED has been specifically attracting attention from a point of achieving tremendous low power consumption of a gas sensor module. These optical devices have another great feature that the optical devices can be sealed by a resin mold. Sealing by the resin mold ensures easily downsizing the light emitting portion and the light receiving portion, and ensures improving respective performances of the light emitting portion and the light receiving portion, that is, enhancing the luminous efficiency of the LED and enhancing the SNR of the light receiving portion achieve enhancing a resolution and the SNR of the gas sensor that employs these optical devices.

In addition to improve the performances of the light emitting portion and the light receiving portion, future gas sensors using NDIR method will require a long-term stability. In aspect of the long-term stability, a signal drift caused by stress and heat is apprehended.

That is, in a package (hereinafter also referred to as a resin-molded package) where an optical device is molded by a sealing resin, a stress variation caused by moisture absorption and heat of the resin used for the mold possibly influences on a variation of an amount of luminescence and a variation of light receiving sensitivity of the optical device such as the infrared device and the LED. Depending on the specification, especially, a gas sensor that requests resolution for a ppb order causes a significant error on a measurement result of gas concentration even when an optical signal level slightly varies due to an influence of a disturbance.

As a method for reducing the stress variation, there has been proposed a method such that, for example, transmission means is disposed on a region for receiving or emitting light on a semiconductor chip and the other region is sealed with an insulating resin that includes a filler, so as to match a thermal expansion coefficient of a material of the semiconductor chip with a thermal expansion coefficient of the resin, thus suppressing the stress variation (for example, see PTL 1).

For example, PTL 2 discloses a method such that a protective film is disposed to cover a substrate and an infrared light receiving element mounted on the substrate, that is, a protective film for protecting the infrared light receiving element is disposed between the sealing resin of the package and the infrared light receiving element, thus protecting the infrared light receiving element from the stress of the sealing resin. PTL 2 also discloses a method such that the protective film is disposed to protect the infrared light receiving element for reducing the influence of the stress, and furthermore, a cavity region is disposed between the protective film and the sealing resin to improve photoelectric conversion efficiency, thus ensuring the reduction of the influence of the stress.

CITATION LIST

Patent Literature

PTL 1: JP 2011-205068 A
PTL 2: Japanese Patent No. 6006602

SUMMARY OF INVENTION

Technical Problem

However, as described above, in the method where the transmission means is disposed on the region for receiving or emitting light and the other region is sealed with the insulating resin that includes the filler, on a portion where the transmission means is not disposed, a stress is caused by moisture absorption and heat of the resin similar to conventional method, thus possibly affecting a variation of an amount of luminescence and a variation of light receiving sensitivity of an optical device (a quantum type infrared sensor, LED).

In the method where the cavity region is disposed between the protective film and the sealing resin, the photoelectric conversion efficiency is ensured to improve while the influence of the stress on the element is not reduced. Therefore, a method for reducing the stress itself that the element receives so as to reduce the influence of the stress with more certainty has been desired.

The present invention has been made in view of the above-described circumstances, and it is an object of the present invention to provide an optical device and a method for manufacturing the optical device that ensures reduction of an influence caused by the occurrence of stress variation on a mold resin due to an environmental change and the like while reducing stress itself that an element receives and efficiently exchanging light between a light emitting portion and a light receiving portion, and an outside of the optical device.

Solution to Problem

To achieve the above-described object, an optical device according to one embodiment of the present invention includes a substrate, a semiconductor layer formed on the substrate and configured to receive or emit a light, a stress relaxation layer having a shape to cover an entire surface of the semiconductor layer, and a resin sealing body configured to seal the stress relaxation layer and the substrate excluding a surface of the substrate on an opposite side of a surface on which the semiconductor layer is formed. The light is entered or emitted from a side of the substrate. The resin sealing body includes a through hole configured to pass through from a top surface of the resin sealing body to the stress relaxation layer.

A method for manufacturing an optical device according to another embodiment of the present invention includes: fixing a semiconductor chip between lead frames by die bonding, the semiconductor chip being formed on a substrate, the semiconductor chip including a semiconductor layer configured to receive or emit a light; electrically connecting the lead frame to the semiconductor chip by a wire; forming a stress relaxation layer on a surface on which the semiconductor layer of the substrate is formed; and sealing the stress relaxation layer and the substrate excluding a surface of the substrate on an opposite side of the surface on which the semiconductor layer is formed such that a through hole is formed to cause a part of the stress relaxation layer to be exposed, by filling a resin between the lead frames after forming the stress relaxation layer.

Advantageous Effects of Invention

According to one aspect of the present invention, an influence of a stress variation generated on a resin sealing body can be reduced, and an optical device that ensures long-term stability can be provided.

BRIEF DESCRIPTION OF DRAWINGS

FIGS. 11A to 11E are cross-sectional process drawings describing the other example of the method for manufacturing the cavity;

FIGS. 21A to 21E are cross-sectional process drawings describing an exemplary method for manufacturing a cavity;

DESCRIPTION OF EMBODIMENTS

Figure 1:
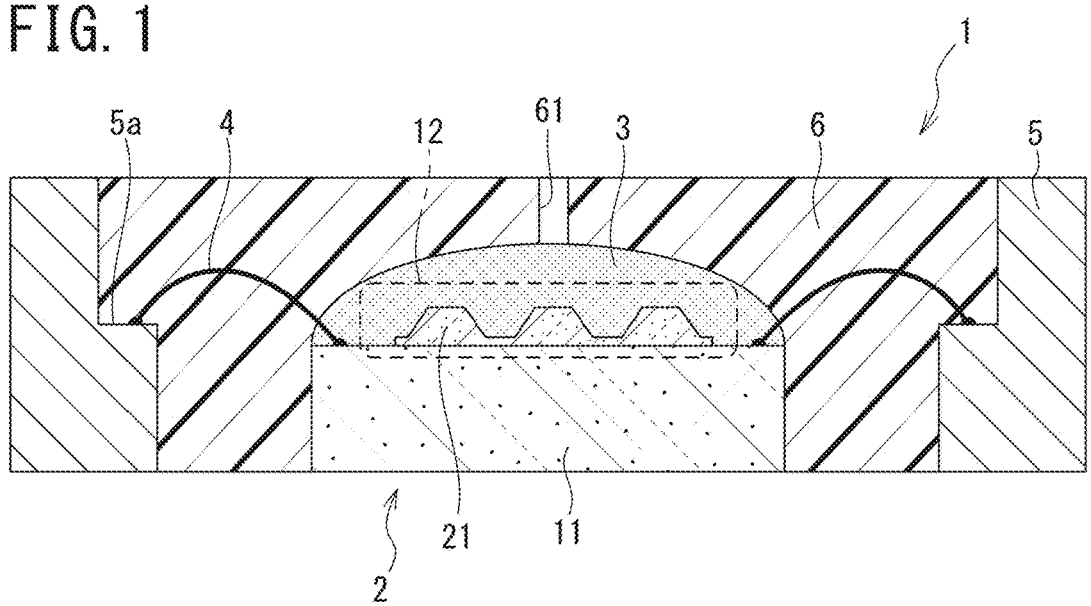
FIG. 1 is a cross-sectional view illustrating a schematic configuration of an optical device according to a first embodiment of the present invention.

The following detailed description describes many specific concrete configurations for complete understanding of the embodiments of the present invention. However, it is apparent that other embodiments and aspects can be embodied without being limited to the specific concrete configurations. The following embodiments do not limit the invention according to the claims and include all the combinations of the distinctive configurations described in the embodiments.

The following describes one embodiment of the present invention with reference to the drawings. In the following description of the drawings, like reference numerals designate identical elements. However, the drawings are schematically illustrated, and relations between thicknesses and planar dimensions, ratios of thicknesses of respective layers, and the like are different from actual values.

First, a first embodiment of the present invention will be described.

FIG. 1 is a cross-sectional configuration diagram describing an optical device according to the first embodiment of the present invention. FIG. 1 illustrates a schematic configuration of an optical device 1 according to the first embodiment.

The optical device 1 according to the first embodiment includes a light receiving/emitting element 2 that has a photoelectric conversion function, a protective layer (stress relaxation layer) 3, and a terminal portion 5 connected to the light receiving/emitting element 2 by a wire 4 connected to a wire pad (not illustrated) of the light receiving/emitting element 2. The light receiving/emitting element 2 includes a substrate 11 and an active portion 12 formed on the substrate 11. The protective layer 3 is continuously formed to cover the active portion 12 and to cover at least a part of the substrate 11. The protective layer 3 is formed to have a thickness increasing toward the center of the substrate 11. Between the terminal portion 5 and the light receiving/emitting element 2, a mold resin (a resin sealing body) 6 is filled. The mold resin 6 includes a through hole 61 that extends in a direction from a top surface of the mold resin 6 to the protective layer 3 to pass through the mold resin 6.

The protective layer 3 only needs to be disposed to cover at least an entire surface of the active portion 12, and is not necessarily required to cover the substrate 11.

The following sequentially describes each component of the optical device 1.

<Substrate>

The optical device 1 illustrated in FIG. 1 has an entrance and exit of light on a surface on an opposite side of a surface where the active portion 12 of the substrate 11 is formed. In this case, preferably, the substrate 11 has a high transmittance, for example, a transmittance equal to or more than 30% to a wavelength of an emitted or a received light. Further, for enhancing a light propagation efficiency between a semiconductor lamination portion 21 of the optical device 1 and the outside of the optical device 1, the transmittance is preferably configured to be equal to or more than 40% or 50%.

The substrate 11 is selected such that the semiconductor lamination portion 21 is formed to have a lamination with a high quality. As a specific example, a substrate made of Si, GaAs, sapphire, and similar material may be applied to the substrate 11. As described above, since the optical device 1 includes the substrate 11 as a light extraction port or a light emission port, the substrate 11 is required to have a high transmittance, for example, equal to or more than 30% to the wavelength. For example, when the semiconductor lamination portion 21 is made of a narrow-gap semiconductor material (for example, AlInSb) that contains In, Sb, As, and Al, the substrate 11 may be a semi-insulating GaAs. This is preferable because crystalline growth is allowed with high quality and a high transmittance to a light having the wavelength of a few μm is provided.

<Active Portion>

Figure 2:
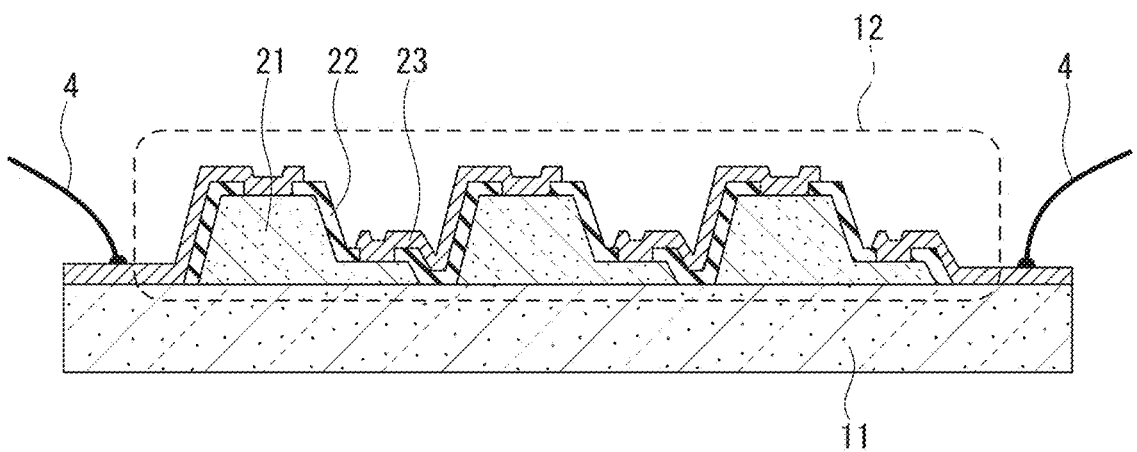
FIG. 2 is a cross-sectional configuration diagram illustrating an exemplary active portion.

As illustrated in FIG. 2, the active portion 12 includes the semiconductor lamination portion 21, an insulating layer 22, and a wiring layer 23.

<Semiconductor Lamination Portion>

Figure 3:
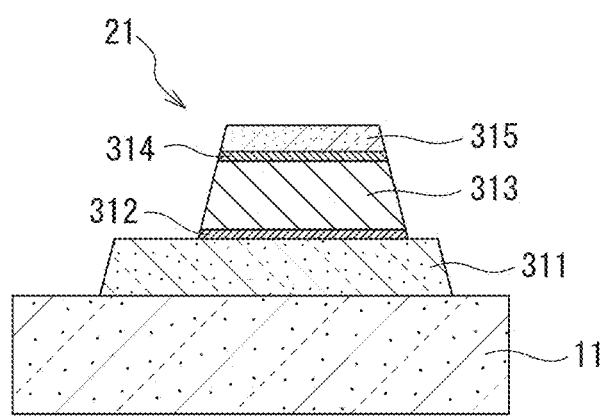
FIG. 3 is a cross-sectional configuration diagram illustrating an exemplary semiconductor lamination portion.

As illustrated in FIG. 3, the semiconductor lamination portion 21 includes a first conductivity-type semiconductor layer 311, a first barrier layer 312, an active layer 313, a second barrier layer 314, and a second conductivity-type semiconductor layer 315, and is configured to emit or receive a light.

The active portion 12 disposed in the optical device 1 according to one embodiment of the present invention is not limited to the laminated structure described here, and the laminated structure (including the material and the number of layers) is not specifically limited insofar as the structure is configured to emit or receive the light having the wavelength necessary for a use of a gas sensor and the like.

As a specific example, a PIN structure that includes the first conductivity-type semiconductor layer 311 as an n-type semiconductor, the active layer 313 as an intrinsic semiconductor, and the second conductivity-type semiconductor layer 315 as a p-type semiconductor may be employed. In this case, for enhancing the luminous efficiency, the first barrier layer 312 configured to reduce hole diffusion to the first conductivity-type semiconductor layer 311 and the second barrier layer 314 configured to reduce electron diffusion to the second conductivity-type semiconductor layer 315 may be disposed. The semiconductor lamination portion 21 is allowed to employ a known material that has sensitivity or a light emitting function to infrared, and for example, a semiconductor layer that contains InSb may be applied.

As illustrated in FIG. 3, the semiconductor lamination portion 21 has a two-step mesa structure. The two-step mesa structure can be formed by photolithography and etching. As a method for etching, wet etching and dry etching may be used.

<Insulating Layer>

A material that has insulation property and can reduce at least any one of physical damage and chemical damage may be employed as the insulating layer 22, and for example, $SiO_2$, SiN, and a laminated body of them may be employed.

<Wiring Layer>

The active portion 12 may include multiple PIN structures (that is, the semiconductor lamination portions 21) that are connected to one another. For example, as illustrated in FIG. 2, the multiple PIN structures may be connected in series. In this case, the wiring layer 23 has a role to ensure the electrical connection. The wiring layer 23 is made of a conductive material that contains Au, Ti, Pt and the like. The wiring layer 23 may have the laminated structure formed of Au, Ti, Pt and the like.

<Protective Layer>

The optical device 1 according to one embodiment of the present invention includes the protective layer 3 configured to cover the light receiving/emitting element 2. The protective layer 3 is made of a material that reduces stress variation caused by deformation of the mold resin 6 due to deformation of the protective layer 3 when the mold resin 6 expands. As a material that has such property, a material more flexible than the resin material constituting the substrate 11 and the mold resin 6, that is, a material having a low Young's modulus is preferable, and the material may have the Young's modulus equal to or less than 70 GPa. As the protective layer 3, silicone resin, photosensitive silicone resin, PIMEL (photosensitive polyimide), epoxy, and similar materials may be applied. The material of the protective layer 3 is preferable as the Young's modulus is small, and preferably, the Young's modulus is lower than at least the Young's modulus of the substrate 11.

The protective layer 3 has a height of the surface from a top surface of the substrate 11 as a reference such that, for example, when a plurality of the semiconductor lamination portions 21 are formed on the substrate 11 as illustrated in FIG. 1, the height is preferably 0.5 μm or more, further preferably 1 μm or more on a position of the semiconductor lamination portion 21 formed closest to an outer periphery of the substrate 11, and the upper limit value of the height is preferably approximately 200 μm. On a position of the semiconductor lamination portion 21 formed at a proximity of the center of the substrate 11, the protective layer 3 has the height of the surface from the top surface of the substrate 11 as a reference configured corresponding to the height of the surface of the protective layer 3 on the position of the semiconductor lamination portion 21 formed closest to the outer periphery of the substrate 11. That is, when the height of the surface of the protective layer 3 from the top surface of the substrate 11 as a reference on the position of the semiconductor lamination portion 21 formed on the most edge portion is defined as H, the height of the surface of the protective layer 3 on the position of the semiconductor lamination portion 21 formed at a proximity of the center of the substrate 11 is preferably approximately equal to or more than 1.5×H μm and equal to or less than 100×H μm.

<Terminal Portion>

The terminal portion 5 has an electrical connection function and a role as a supporting portion in assembly. Therefore, the terminal portion 5 is disposed to have an upper end portion and a lower end portion exposed to top and bottom surfaces of the optical device 1, respectively.

The electrical connection here means to electrically connect the active portion 12 to an external circuit. For the electrical connection inside the optical device 1, the wire 4 disposed by a wire bonding process is used. The wire 4 is connected to the terminal portion 5 and the wiring layer 23 (see FIG. 2) disposed on the substrate 11 to function as a wire pad.

The terminal portion 5 has a stepped surface 5a formed by removing a part of a side facing the light receiving/emitting element 2. The wire 4 is connected to the stepped surface 5a of the terminal portion 5. The stepped surface 5a is formed by half etching of the terminal portion 5.

The terminal portion 5 has a thickness of, for example, 0.5 mm or less.

The terminal portion 5 is made of a metallic material such as copper (Cu) or a copper alloy, and iron (Fe) or an alloy containing iron, and especially, preferred to be made of copper. On the terminal portion 5, for example, a nickel (Ni)-palladium (Pd)-gold (Au) plating may be applied over surfaces other than the outer surfaces of the terminal portion 5 exposed from the mold resin 6. The nickel (Ni)-palladium (Pd)-gold (Au) plating is a laminated plating where a nickel (Ni) plating, a palladium (Pd) plating, and a gold (Au) plating are formed in this order on a predetermined surface of the terminal portion 5 made of copper (Cu) and similar material. The nickel (Ni) plating contributes to improvement of strength of the terminal portion 5, the palladium (Pd) plating contributes to improvement of wire bonding property of the wire 4, and the gold (Au) plating contributes to improvement of solderability on mounting. On the terminal portion 5, an argentum (Ag) plating may be applied over a surface where the wire 4 is wire-bonded, and a tin (Sn) plating may be applied over a top surface (amounting surface) of the terminal portion 5 exposed from a top surface of the mold resin 6. The argentum (Ag) plating contributes to the improvement of the wire bonding property of the wire 4, and the tin (Sn) plating contributes to the improvement of the solderability on mounting.

<Mold Resin>

The optical device 1 according to one embodiment of the present invention includes the mold resin 6 that seals the light receiving/emitting element 2 via the protective layer 3. The mold resin 6 has a role to fix the substrate 11 and the terminal portion 5. In the optical device 1 according to one embodiment of the present invention, the light receiving/emitting element 2 is sealed by the mold resin 6 excluding the bottom surface. However, the mold resin 6 only needs to be configured such that a desired light can enter the semiconductor lamination portion 21 via the substrate 11, and it is not specifically limited which surface of the light receiving/emitting element 2 is covered. For example, the mold resin 6 may cover a part of the bottom surface of the light receiving/emitting element 2, and does not have to cover a part of the side surface of the light receiving/emitting element 2.

From an aspect of mass-productivity and mechanical strength, the mold resin 6 may be epoxy resin used for a common semiconductor device. However, for reducing the influence of the stress due to the moisture absorption of the optical device 1, a material having a low water absorption rate is preferable.

Especially in the case of the optical device 1 that includes the semiconductor lamination portion 21 formed of the narrow-gap semiconductor, a leak current in the structure of the optical device 1 varies due to even a slight stress, thus easily causing variation in electric property. Therefore, for the mold resin 6, a resin having a low stress due to the moisture absorption and the temperature may be preferably selected.

The material constituting the mold resin 6 may include a filler, inevitably mixed impurities, and similar material besides the resin material such as the epoxy resin. A mixing amount of the filler is preferably 50 volume % or more and 99 volume % or less, more preferably 70 volume % or more and 99 volume % or less, and further preferably 85 volume % or more and 99 volume % or less among the materials constituting the mold resin 6.

The mold resin 6 has a thickness, that is, a length between the top surface and the bottom surface of the mold resin 6 in FIG. 1 of preferably 0.5 mm or less, for example.

The through hole 61 only needs to be a through hole extending perpendicular to the substrate 11 or extending in a direction close to perpendicular. Disposing the through hole 61 ensures the reduction of the stress in a package due to a thermal history of the optical device 1.

The through hole 61 may be disposed on any portion of the mold resin 6 insofar as the through hole 61 penetrates to the protective layer 3.

The through hole 61 is preferred to be disposed at a proximity of the center of the protective layer 3 in top view because the stress is efficiently reduced. For example, in a case of the optical device 1 where a plurality of the semiconductor lamination portions 21 are arranged lengthwise and crosswise in a matrix, the through hole 61 is disposed on the center of the protective layer 3 that covers the entire surface of the active portion 12 including the plurality of the semiconductor lamination portions 21.

A plurality of the through holes 61 may be disposed, and it is only necessary that at least one through hole 61 is disposed.

The through hole 61 may be formed in any shape in top view, and may be formed in, for example, a circular shape and a slit shape. The through hole 61 that has the circular shape in top view is preferable because the through hole 61 is easily formed with a high aspect ratio such as "1:100". When it is necessary to prevent invasion of dust and the like through the through hole 61 and similar case, the through hole 61 is preferred to be formed in the slit shape.

Next, a method for manufacturing the optical device 1 will be described by referring to cross-sectional views illustrated in FIGS. 4A to 4D.

First, a wafer dicing process is performed to individualize the substrate 11 from a state of a wafer into chips of the light receiving/emitting element 2 (hereinafter also referred to as semiconductor chips 2).

Figure 4A:
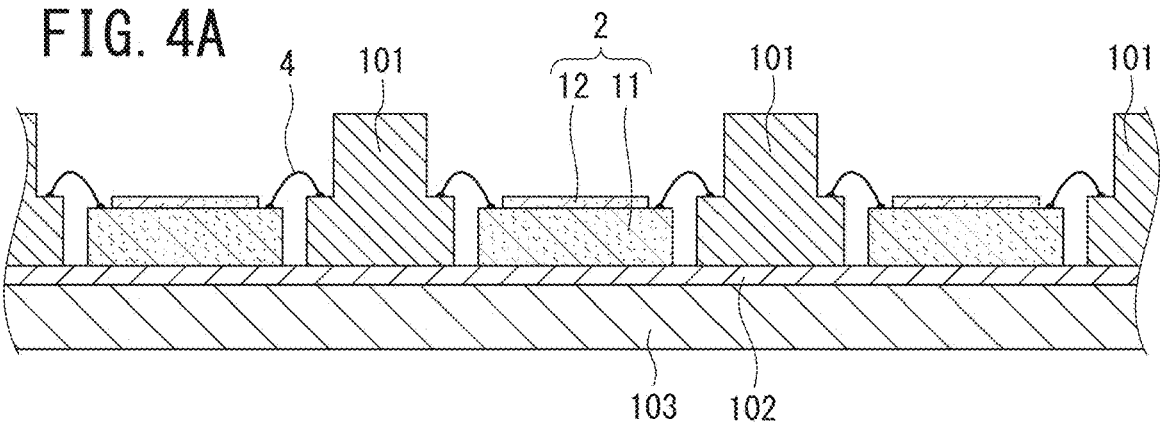
FIGS. 4A to 4D are exemplary cross-sectional views describing manufacturing processes of the optical device according to the first embodiment.

Next, a plurality of the individualized semiconductor chips 2 are fixed on an adhesive sheet 102 where lead frames 101, which are formed as the terminal portions 5 later, are fixed, and the wire bonding process is performed to electrically connect the semiconductor chip 2 to the lead frame 101 (the terminal portion 5) by the wire 4 (FIG. 4A). The adhesive sheet 102 may be preliminarily included on the lead frame 101.

Figure 4B:
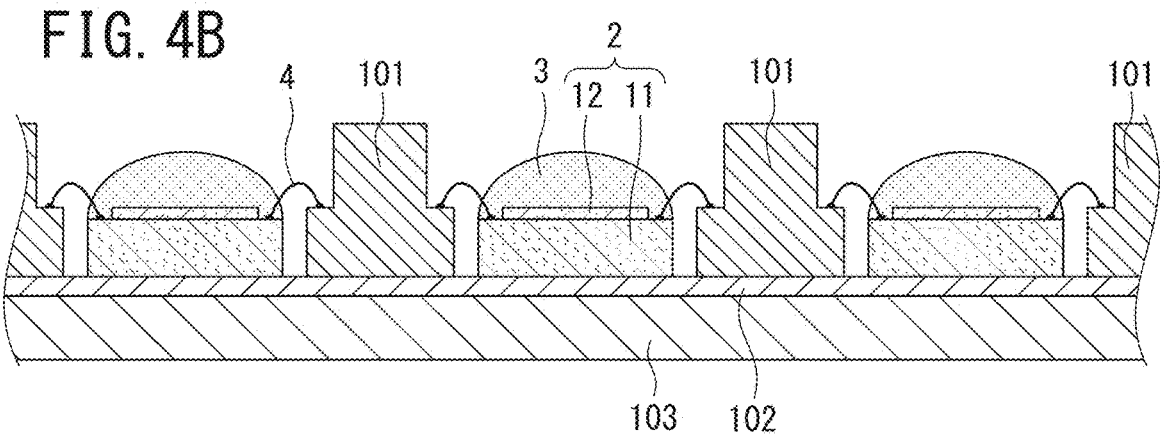

Next, a potting process is performed to form the protective layer 3 (FIG. 4B). That is, a resin for forming the protective layer 3 is dropped on the substrate 11 so as to cover the entire surface of the active portion 12 of the semiconductor chip 2. Then, a shape of the dropped resin is held as it is to form the protective layer 3. This forms the protective layer 3 having the thickness increased toward the center of the substrate 11. In the resin potting process, a dispenser device for liquid resin may be used.

Figure 4C:
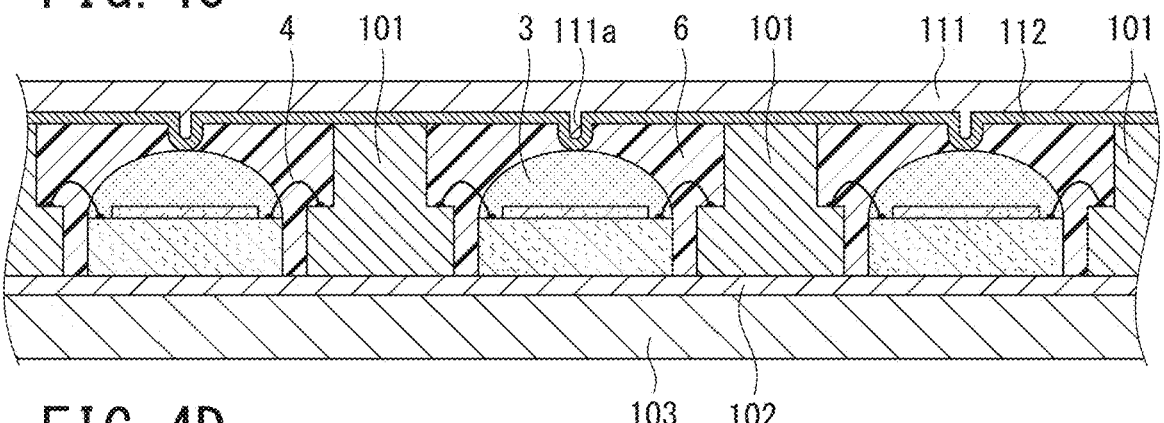

Next, a transfer molding is performed by using an upper mold 111 to form the mold resin (FIG. 4C).

The upper mold 111 includes protrusions 111a for forming the through holes 61 on positions facing the centers of the substrates 11. On the upper mold 111, a sheet 112 is arranged so as to cover the entire surface on a side where the protrusions 111a are formed. The sheet 112 is made of Teflon (registered trademark), for example. When the upper mold 111 including the protrusions 111a is used to fill a molten resin to be formed as the mold resin 6, the sheet 112 disposed on the upper mold 111 reduces the stress acting on the optical device when the upper mold 111 contacts the optical device. Then, damages on the optical device due to the upper mold 111 are reduced and a frequency of defective products is lowered, thus providing the effects of quality improvement and mass-productivity improvement of the optical device.

Figure 4D:
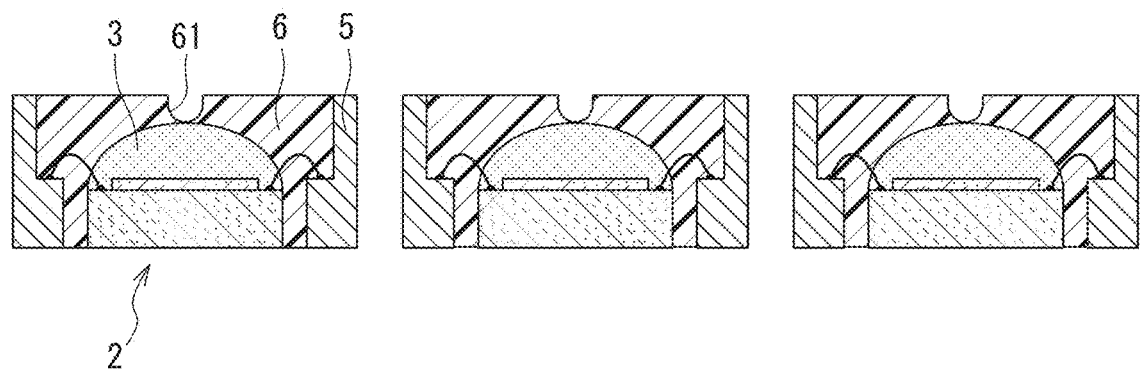

The upper mold 111, on which the sheet 112 is disposed, is positioned to contact the lead frame 101 (the terminal portion 5) so as to face a lower mold 103, and the molten resin is filled between the sheet 112 and the adhesive sheet 102 from a side. Before the process performing the transfer molding, a process to cure the protective layer 3 may be provided. Filling the molten resin forms the through hole 61 that passes through the mold resin 6 on the center of the substrate 11 as illustrated in FIG. 4D.

Next, the upper mold 111 and the lower mold 103 are removed and the filled mold resin 6 is cured. Then, an individualization process (the dicing process) is performed to individualize the substrates 11 (FIG. 4D).

Here, when the resin for forming the protective layer 3 is dropped on the substrate 11 so as to cover the entire surface of the semiconductor lamination portion 21 on the semiconductor chip 2, the resin has a hemispherical cross section as illustrated in FIG. 4B. That is, the protective layer 3 formed while holding this state has the thickness increased toward the center.

Figure 5:
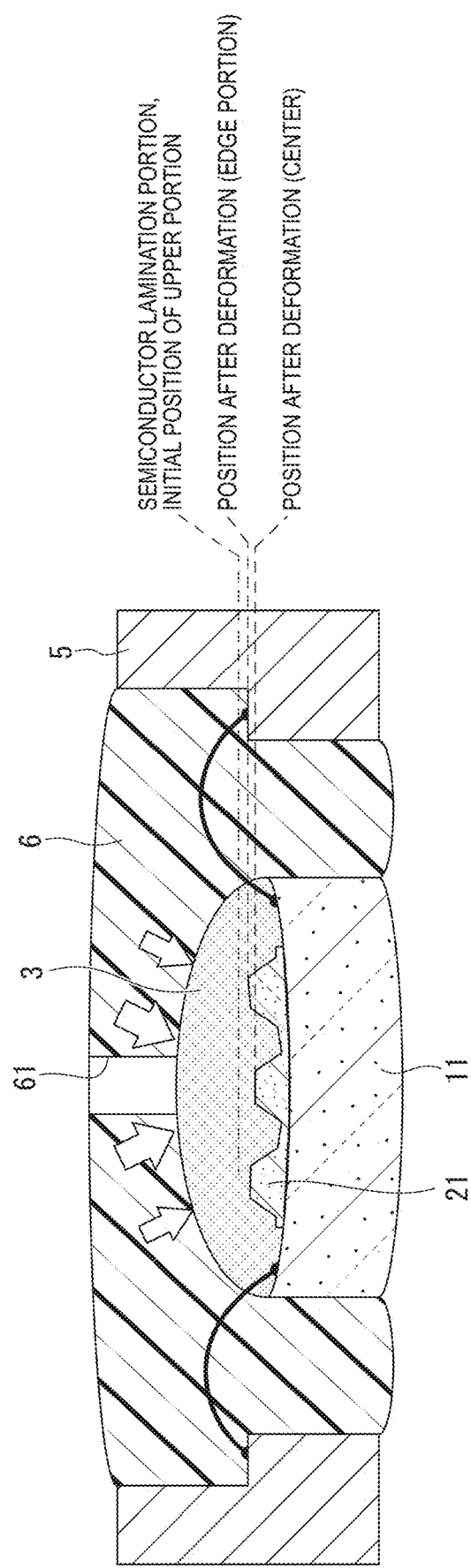
FIG. 5 is an explanatory drawing used for describing operations of the optical device according to the first embodiment.

In the optical device 1 where the protective layer 3 is formed to have the hemispherical cross section as illustrated in FIG. 1, when a state where the mold resin 6 is in a dry state and the stress variation does not occur has changed to a state where the mold resin 6 is swollen, for example, as illustrated in FIG. 5, the mold resin 6 expands most at the position of the center of the substrate 11. Therefore, when the protective layer 3 is not disposed, the center of the substrate 11 significantly curved and the center of the substrate 11 is depressed. The deformation of the substrate 11 causes variation of the position of the semiconductor lamination portion 21 formed on the substrate 11, that is, a relative position of the semiconductor lamination portion 21 to the terminal portion 5. Since the center of the substrate 11 is depressed, the relative position of the semiconductor lamination portion 21 to the terminal portion 5 significantly varies as the semiconductor lamination portion 21 is positioned close to the center of the substrate 11.

Here, the optical device 1 illustrated in FIG. 5 is configured such that the protective layer 3 is disposed on the substrate 11 so as to cover the entire surface of the semiconductor lamination portion 21 and the protective layer 3 has the thickness increased toward the center of the substrate 11.

Therefore, the protective layer 3 acts so as to more reduce the deformation of the mold resin 6 on the substrate center compared with the edge portion, thus reducing the deformation of the substrate 11. Consequently, the amount of variation of the semiconductor lamination portion 21 is lowered. That is, the influence on the optical device 1 can be reduced in accordance with the stress variation of the mold resin 6, thus ensuring the reduction of variation in property caused by the influence of the mold resin 6 on the optical device 1.

Figure 6A:
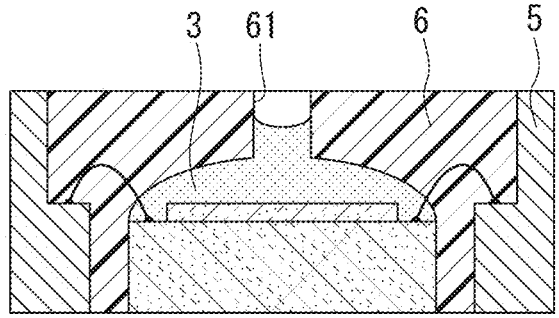
FIGS. 6A and 6B are explanatory drawings used for describing the operations of the optical device according to the first embodiment.
Figure 6B:
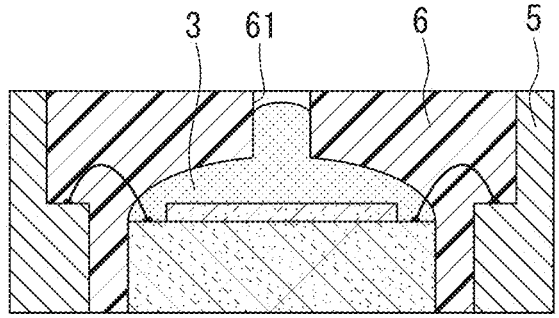

In the optical device 1, the mold resin 6 includes the through hole 61. Here, in the case where the through hole 61 is disposed, when the resin forming the protective layer 3 has not expanded, that is, the resin is in the state of low temperature or dry and similar state, the protective layer 3 is in the state illustrated in FIG. 6A, for example. On the other hand, when the resin forming the protective layer 3 has expanded, that is, the resin is in the state of high temperature or moisture absorption and similar state, the protective layer 3 is extruded to the through hole 61 side as illustrated in FIG. 6B. That is, the protective layer 3 becomes to be housed in the through hole 61 by an increase of the volume due to the swelling. Therefore, the swollen protective layer 3 also ensures reducing the stress variation acting on the active portion 12. FIGS. 6A and 6B are exaggeratedly illustrated for facilitating understanding.

Disposing the through hole 61 ensures reducing the stress caused by the deformation of the protective layer 3 due to the thermal history of the optical device 1 to act on the semiconductor lamination portion 21. This preferably ensures the reduction of the variation in property of the optical device 1 caused by the deformation and the like of the protective layer 3, especially in the optical device 1 that operates in a wide temperature range.

In the case of the optical device 1 illustrated in FIG. 1, the active portion 12 includes a plurality of the semiconductor lamination portions 21 electrically connected to one another. This achieves a high SNR and improves adhesion due to the enlarged contacted area with the protective layer 3.

While the protective layer 3 is formed mainly for reducing the variation in the electric property of the optical device 1 caused by the stress, the protective layer 3 is required not to reduce the variation in the electric property of the optical device 1 but to obtain desired variation in the electric property depending on usage. When the desired variation in the electric property is required, the protective layer 3 may be formed with desired resin amount. This preferably ensures controlling a relation between the resin deformation and the electric property of the optical device 1 in the protective layer formation process.

Next, a second embodiment of the present invention will be described.

In the second embodiment, in the optical device 1 in the first embodiment illustrated in FIG. 1, the protective layer 3 is formed by a spin coat method, and an optical device 1 in the second embodiment is similar to the optical device 1 in the first embodiment excluding the difference in shape of the protective layer 3.

Figure 7:
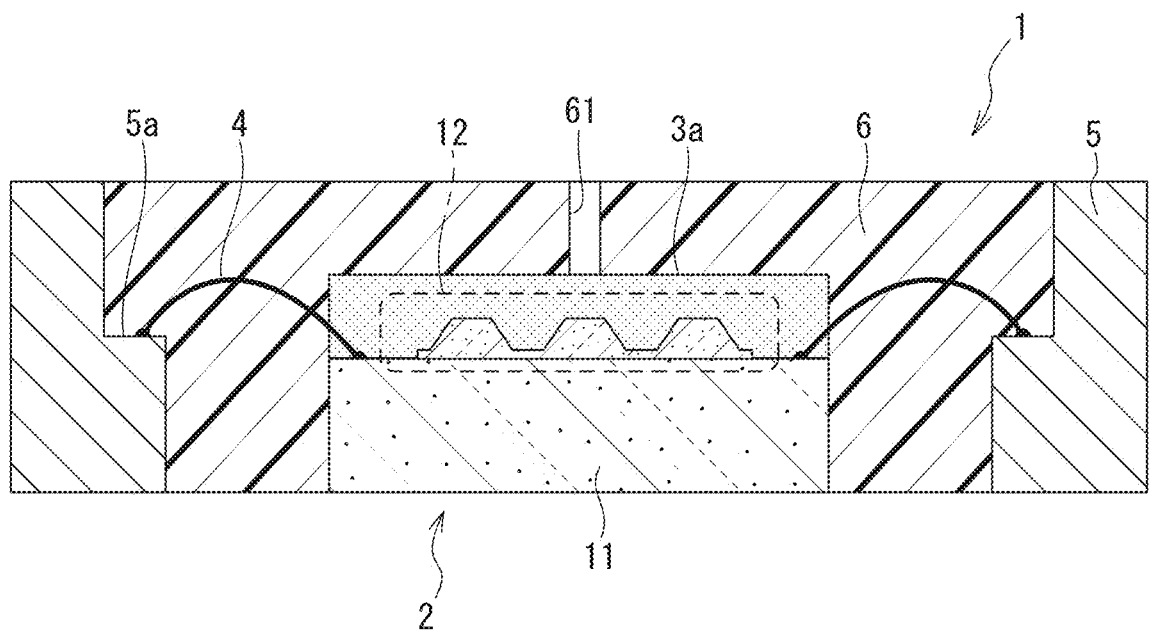
FIG. 7 is a cross-sectional view illustrating a schematic configuration of an optical device according to a second embodiment.

That is, as illustrated in FIG. 7, a protective layer 3a in the second embodiment has an approximately uniform thickness.

Even in the optical device 1 illustrated in FIG. 7, the protective layer 3a acts so as to reduce the deformation of the mold resin 6, similarly to the optical device 1 in the above-described first embodiment. Since the mold resin 6 includes the through hole 61, when the resin forming the protective layer 3 has expanded, for example, the state of high temperature or moisture absorption and similar state, the protective layer 3a is housed in the through hole 61. This also ensures the reduction of the deformation of the mold resin 6, thus reducing the stress variation acting on the active portion 12. Accordingly, the optical device 1 according to the second embodiment also provides the operational advantage equivalent to the optical device 1 in the first embodiment.

Next, a third embodiment of the present invention will be described.

An optical device 1 in the third embodiment has cavities between a mold resin and a protective layer.

Figure 8:
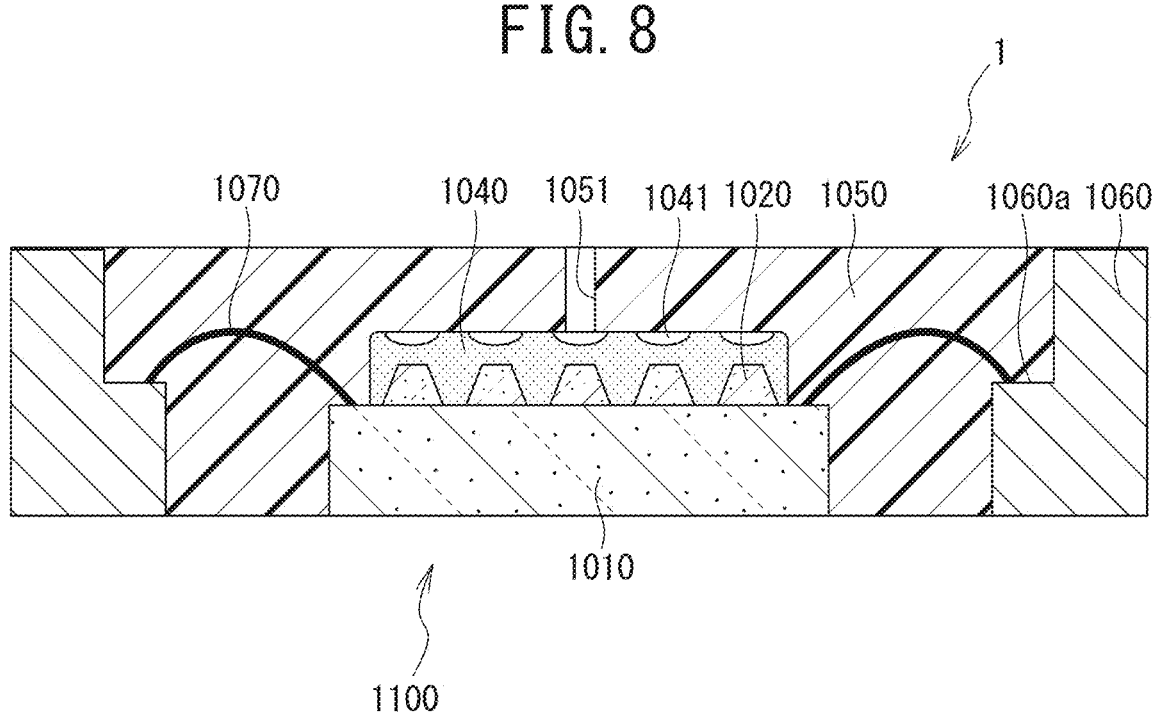
FIG. 8 is a cross-sectional view illustrating a schematic configuration of an optical device according to a third embodiment.

FIG. 8 is a cross-sectional view illustrating a schematic configuration of an exemplary optical device 1 according to the third embodiment of the present invention. For simplification, FIG. 8 illustrates only main parts.

Figure 9:
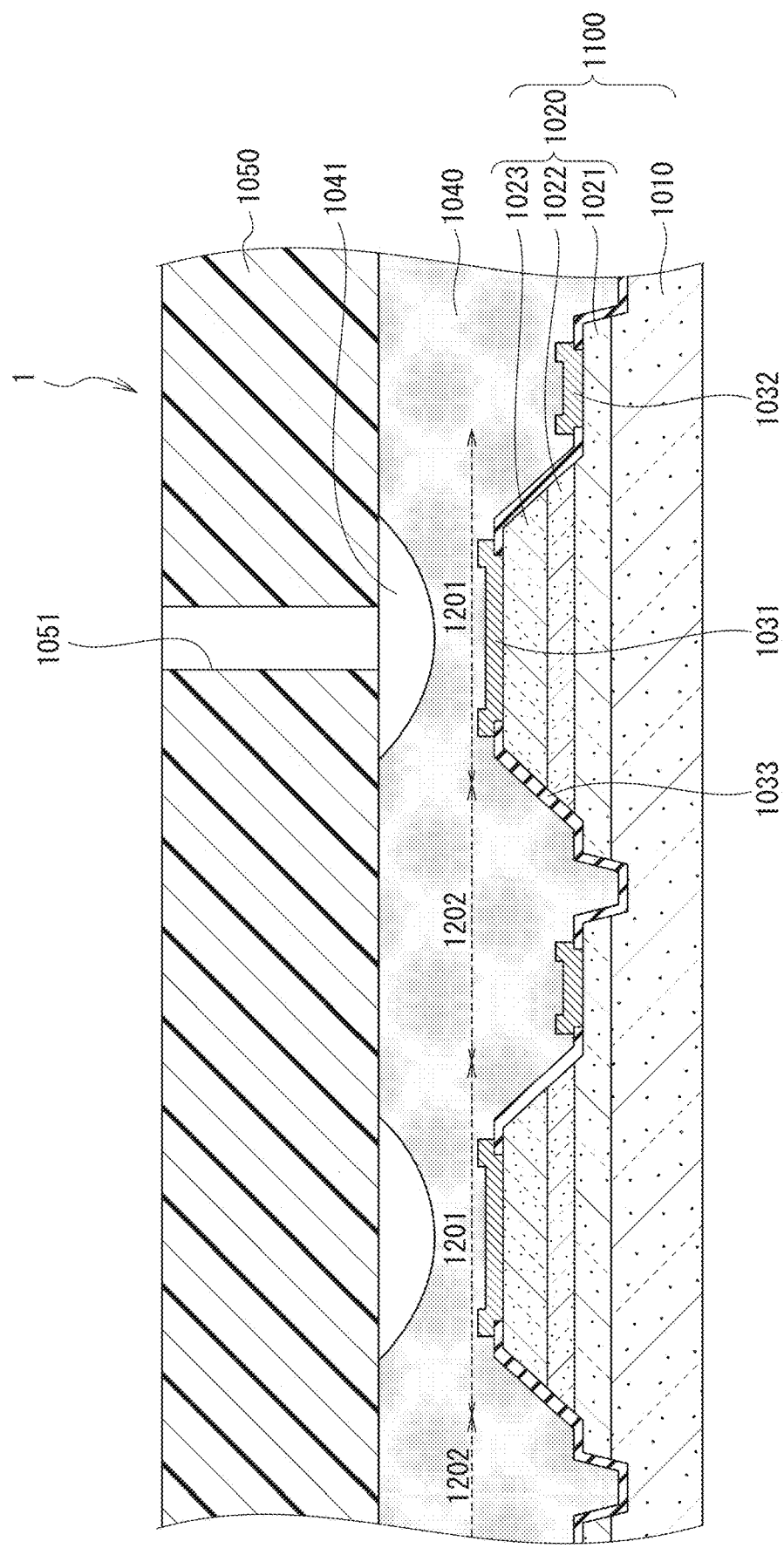
FIG. 9 is a cross-sectional configuration diagram illustrating an exemplary detail of a main part of FIG. 8.

The optical device 1 according to the third embodiment of the present invention is an optical device where the light receiving portion or the light emitting portion has a mesa structure, and the optical device 1 includes a light receiving/emitting element 1100, a protective layer 1040, a mold resin (a resin sealing body) 1050, and a terminal portion 1060. As illustrated in FIG. 9, the light receiving/emitting element 1100 includes a semiconductor substrate 1010, semiconductor lamination portions 1020, electrodes 1031 and 1032, and an insulating coating layer 1033. The optical device 1 illustrated in FIG. 8 receives and emits infrared light via a surface of the light receiving/emitting element 1100 exposed to a bottom surface of the mold resin 1050.

The semiconductor substrate 1010 has infrared transparency.

The semiconductor lamination portion 1020 is formed of a first conductivity-type semiconductor layer (for example, an n-type semiconductor layer) 1021, an intrinsic semiconductor layer 1022, and a second conductivity-type semiconductor layer (for example, a p-type semiconductor layer) 1023, which are laminated on the semiconductor substrate 1010 in this order. As described below, the semiconductor lamination portion 1020 can be divided into a mesa structure portion 1201 formed on the semiconductor substrate 1010 and a bottom portion 1202 as a region excluding the mesa structure portion 1201 on the semiconductor substrate 1010. The electrodes 1031 and 1032 are formed on at least a part of each of the mesa structure portion 1201 and the bottom portion 1202, respectively.

The protective layer 1040 covers the light receiving/emitting element 1100 (that is, the semiconductor substrate 1010 and the semiconductor lamination portion 1020). The mold resin 1050 packages the light receiving/emitting element 1100 (the semiconductor substrate 1010 and the semiconductor lamination portion 1020) via the protective layer 1040. Furthermore, the mold resin 1050 includes a through hole 1051 that passes through the mold resin 1050 to reach a cavity 1041 described below.

The protective layer 1040 has different top surface heights between on the mesa structure portion 1201 and on the bottom portion 1202 when an interface between the semiconductor substrate 1010 and the semiconductor lamination portion 1020 is a reference. The cavity 1041 is formed between the protective layer 1040 and the mold resin 1050 at least partially above the mesa structure portion 1201.

The cavity 1041 has a thickness of 2 μm or more and 200 μm or less, preferably. Difference in linear expansion coefficient between the protective layer 1040 and the mold resin 1050 is 50 ppm or more and 500 ppm or less, preferably.

While an illustration is omitted, the light receiving/emitting element 1100 may be configured such that a plurality of the light receiving/emitting elements 1100 are connected in series or in parallel, the electrode 1031 on the mesa structure portion 1201 of one light receiving/emitting element 1100 is electrically connected to the electrode 1032 on the bottom portion 1202 of another light receiving/emitting element 1100 on a part of an inclined surface of the mesa structure portion 1201 of the one light receiving/emitting element 1100, and another part of the inclined surface of the mesa structure portion 1201 of the one light receiving/emitting element 1100 is not covered with a metal.

The following sequentially describes each component.

<Semiconductor Substrate>

In the third embodiment of the present invention, the semiconductor substrate 1010 is a substrate where the semiconductor lamination portion 1020 having a photodiode structure of a PN junction or a PIN junction can be formed. The semiconductor substrate 1010 is not specifically limited insofar as the semiconductor substrate 1010 has the infrared transparency. The semiconductor substrate 1010 may be any of a substrate that includes a material including a semiconductor or an insulating substrate. That is, "the semiconductor substrate" means a substrate constituting the light receiving/emitting element 1100 as a semiconductor device. The semiconductor substrate 1010 includes, for example, a substrate made of Si, GaAs, sapphire, InP, and similar material. When a layer including InSb is used for the semiconductor lamination portion 1020, preferably, a GaAs substrate is used from an aspect of forming the semiconductor lamination portion 1020 with few lattice defects. In this embodiment, "having the infrared transparency" means that the infrared transmittance is 10% or more, preferably 50% or more, and more preferably 65% or more.

<Semiconductor Lamination Portion>

The semiconductor lamination portion 1020 in the optical device 1 according to the third embodiment of the present invention has the photodiode structure of the PIN junction formed of the first conductivity-type semiconductor layer 1021, the intrinsic semiconductor layer 1022, and the second conductivity-type semiconductor layer 1023. The semiconductor lamination portion 1020 in the third embodiment of the present invention is not specifically limited insofar as the semiconductor lamination portion has the photodiode structure or an LED structure of the PN junction or the PIN junction. While the semiconductor lamination portion 1020 according to the third embodiment has the photodiode structure of the PIN junction formed of the first conductivity-type semiconductor layer 1021, the intrinsic semiconductor layer 1022, and the second conductivity-type semiconductor layer 1023, the semiconductor lamination portion 1020 may has the photodiode structure of the PN junction formed of the first conductivity-type semiconductor layer 1021 and the second conductivity-type semiconductor layer 1023. A known material that has sensitivity to infrared may be employed as the semiconductor lamination portion 1020, and for example, a semiconductor layer including InSb may be employed.

The semiconductor lamination portion 1020 in the optical device 1 according to the third embodiment of the present invention is divided into the mesa structure portion 1201 and the bottom portion 1202. The mesa structure portion 1201 is indicated by a part raised in a plateau shape, and the bottom portion 1202 is indicated by the other part. In this embodiment, the mesa structure portion 1201 is formed of a part of the first conductivity-type semiconductor layer 1021, the intrinsic semiconductor layer 1022, and the second conductivity-type semiconductor layer 1023. The other part of the first conductivity-type semiconductor layer 1021 forms the bottom portion 1202.

The mesa structure portion 1201 and the bottom portion 1202 are formed by photolithography and etching. As a method for etching, wet etching and dry etching may be employed.

<Electrode>

The optical device 1 according to the third embodiment of the present invention includes electrodes 1031 and 1032 on a top of the mesa structure portion 1201 and a part of the bottom portion 1202 of the semiconductor lamination portion 1020. The materials of the electrodes 1031 and 1032 are not specifically limited insofar as the materials are electrically contactable with the semiconductor lamination portion 1020. When a plurality of elements in the optical device are connected in series, it is only necessary that the electrodes are configured such that the electrode on the bottom portion 1202 of one element in the optical device is connected to the electrode on the top of the mesa structure portion 1201 of the other element. A part of the infrared entered from the substrate side is reflected by the electrodes 1031 and 1032. Therefore, the semiconductor lamination portion 1020 covered with the electrodes having large areas provides an advantage of enhancing the light-receiving efficiency.

<Insulating Coating Layer>

The optical device 1 according to the third embodiment of the present invention includes a region not covered with the electrodes 1031 and 1032 and the insulating coating layer 1033 that covers a part of the semiconductor substrate 1010 on the semiconductor lamination portion 1020. The optical device 1 according to the third embodiment of the present invention is not required to include the insulating coating layer 1033. It is expected that the insulating coating layer 1033 reduces physical and chemical damages on the semiconductor lamination portion 1020. A material that has insulation property and can reduce the physical and chemical damages may be employed as the insulating coating layer 1033, and for example, $SiO_2$, SiN, and a laminated body of them may be employed. Typically, the insulating coating layer 1033 does not reflect but mostly transmits the entered infrared.

<Terminal Portion>

The terminal portion 1060 has an electrical connection function and a role as a supporting portion in assembly. Therefore, the terminal portion 1060 is disposed to have a top surface and a bottom surface exposed to top and bottom surfaces of the optical device 1, respectively.

The electrical connection here means an electrical connection of the light receiving/emitting element 1100 to an external circuit. For the electrical connection inside the optical device 1, a wire 1070 disposed by a wire bonding process is used. The wire 1070 is connected to the terminal portion 1060 and the electrodes 1031 and 1032 of the light receiving/emitting element 1100.

The terminal portion 1060 has a stepped surface 1060a formed by removing a part of a side facing the light receiving/emitting element 1100. The wire 1070, made of a conductive material such as gold (Au), is connected to the stepped surface 1060a of the terminal portion 1060. The stepped surface 1060a is formed by half etching of the terminal portion 1060.

The terminal portion 1060 has a thickness of, for example, 0.5 mm or less.

The terminal portion 1060 is made of a metallic material such as copper (Cu) or a copper alloy, and iron (Fe) or an alloy containing iron, and especially, preferred to be made of copper. On the terminal portion 1060, for example, a nickel (Ni)-palladium (Pd)-gold (Au) plating may be applied over surfaces other than the outer surfaces of the terminal portion 1060 exposed from the mold resin 1050. The nickel (Ni)-palladium (Pd)-gold (Au) plating is a laminated plating where a nickel (Ni) plating, a palladium (Pd) plating, and a gold (Au) plating are formed in this order on a predetermined surface of the terminal portion 1060 made of copper (Cu) and similar material. The nickel (Ni) plating contributes to improvement of strength of the terminal portion 1060, the palladium (Pd) plating contributes to improvement of wire bonding property of the wire 1070, and the gold (Au) plating contributes to improvement of solder wettability on mounting. On the terminal portion 1060, an argentum (Ag) plating may be applied over a surface where the wire 1070 is wire-bonded, and a tin (Sn) plating may be applied over a top surface (a mounting surface) of the terminal portion 1060 exposed from a top surface of the mold resin 1050. The argentum (Ag) plating contributes to the improvement of the wire bonding property of the wire 1070, and the tin (Sn) plating contributes to the improvement of the solder wettability on mounting.

<Protective Layer>

The optical device 1 according to the third embodiment of the present invention includes the protective layer 1040 configured to cover the light receiving/emitting element 1100. The protective layer 1040 has the top surface height above the mesa structure portion 1201 lower than the top surface height above the bottom portion 1202 having the interface between the semiconductor substrate 1010 and the semiconductor lamination portion 1020 as a reference. Then, the cavity 1041 is formed between the mold resin 1050 formed on the protective layer 1040 and the protective layer 1040.

The protective layer 1040 may include, for example, photosensitive silicone. From the aspect of easily forming the cavity 1041, a material having high water repellency on a surface is preferable. From the aspect of easily forming the cavity 1041, a material having high smoothness and good followability to unevenness is preferable.

The thickness of the protective layer 1040 is not specifically limited. From the aspect of process margin between the light receiving/emitting element 1100 protection and the protective layer 1040, the protective layer 1040 is preferred to have the thickness of 1 μm or more and 200 μm or less from the uppermost portion of the mesa structure portion 1201.

<Mold Resin>

The optical device 1 according to the third embodiment of the present invention includes the mold resin 1050 that seals the light receiving/emitting element 1100 via the protective layer 1040. In the optical device 1 according to the third embodiment of the present invention, the light receiving/emitting element 1100 is sealed by the mold resin 1050 excluding the bottom surface in FIG. 8. However, the mold resin 1050 only needs to be configured such that the infrared can enter the semiconductor lamination portion 1020 via the semiconductor substrate 1010, and it is not specifically limited which surface of the light receiving/emitting element 1100 is covered. For example, the mold resin 1050 may cover a part of the bottom surface of the light receiving/emitting element 1100, and does not have to cover a part of the side surface of the light receiving/emitting element 1100.

A known material including epoxy resin may be employed as the mold resin 1050, while the material is not limited to this. From the aspect of generating the cavity 1041, the difference in linear expansion coefficient between the mold resin 1050 and the protective layer 1040 is preferably 50 ppm or more, more preferably 100 ppm or more, and further preferably 150 ppm or more. From the aspect of the process margin, the difference in linear expansion coefficient between the mold resin 1050 and the protective layer 1040 is preferably 500 ppm or less, more preferably 400 ppm or less, and further preferably 300 ppm or less.

The mold resin 1050 has a thickness, that is, a length between the top surface and the bottom surface of the mold resin 1050 in FIG. 8 of, for example, 0.5 mm or less.

The material constituting the mold resin 1050 may include a filler, inevitably mixed impurities, and similar material besides the resin material such as the epoxy resin. A mixing amount of the filler is preferably 50 volume % or more and 99 volume % or less, more preferably 70 volume % or more and 99 volume % or less, and further preferably 85 volume % or more and 99 volume % or less among the materials constituting the mold resin 1050.

The mold resin 1050 includes the through hole 1051 that passes through the mold resin 1050 to reach the cavity 1041, and the through hole 1051 only needs to be a through hole extending perpendicular to the semiconductor substrate 1010 or extending in a direction close to perpendicular.

Disposing the through hole 1051 in such way ensures the reduction of the stress in a package due to a thermal history of the optical device 1.

The through hole 1051 may be disposed on any portion of the mold resin 1050 insofar as the through hole 1051 penetrates to the protective layer 1040. For example, the through hole 1051 may be disposed on a region not overlapping with the cavity 1041. From the aspect of efficiently reducing the stress, the through hole 1051 is preferred to be disposed at a proximity of the center of the protective layer 1040 in top view. A plurality of the through holes 1051 may be disposed, and it is only necessary that at least one through hole 1051 is disposed.

For example, in a case of the optical device 1 where a plurality of the mesa structure portions 1201 are arranged in a matrix, the through hole 1051 may be formed at an upper proximity of the mesa structure portion 1201 positioned on the center or a proximity of the center.

The through hole 1051 may be formed in any shape in top view, and may be formed in, for example, a circular shape and a slit shape. The through hole 1051 that has the circular shape in top view is preferable because the through hole 1051 is easily formed with a high aspect ratio such as "1:100". When it is necessary to prevent invasion of dust and the like through the through hole 1051 and similar case, the through hole 1051 is preferred to be formed in the slit shape.

<Cavity>

The cavity 1041 disposed between the protective layer 1040 and the mold resin 1050 is formed in a process for forming the protective layer 1040 and a process for forming the mold resin 1050.

<Method for Controlling Cavity Shape>

The cavity 1041 has a shape (height) that depends on (1) adhesion of the resin forming the protective layer 1040 with the resin forming the mold resin 1050, and depends on (2) the difference in linear expansion coefficient between the mold resin 1050 and the protective layer 1040. Therefore, adjusting parameters of (1) and (2) ensures adjusting the shape such as the height and the area of the cavity 1041 to be formed.

(1) The adhesion of the resin forming the protective layer 1040 with the resin forming the mold resin 1050 can be controlled by cure conditions of both resins. The adhesion can be controlled also by a surface treatment process (for example, an oxygen plasma treatment by RIE (Reactive Ion Etching)) after forming the protective layer 1040. Therefore, by adjusting the cure conditions of the resin forming the protective layer 1040 and the resin forming the mold resin 1050 or process contents in the surface treatment process after forming the protective layer 1040, the height of the cavity 1041 can be adjusted.

(2) Depending on the difference in linear expansion coefficient between the mold resin 1050 and the protective layer 1040, the size of the cavity 1041 to be formed differs. In a cooling process after a transfer molding process in a packaging process, the cavity is allowed to be generated. Then, in this case, as the difference in linear expansion coefficient is increased, the cavity can be increased in size, width, and height.

From the aspect of reducing the influence of the stress of the mold resin 1050, the cavity 1041 has the thickness of, preferably, 2 µm or more and 200 µm or less from the uppermost portion of the mesa structure portion 1201.

Disposing the cavity 1041 above the mesa structure portion 1201 in such way ensures reducing the stress variation generated on the mold resin 1050 to be transmitted to the light receiving/emitting element 1100 because of the cavity 1041 that serves as a buffer even when the stress variation is generated due to the expansion of the mold resin 1050 with heat and similar condition. Therefore, the stress variation of the mold resin 1050 ensures reducing the variation of input characteristics or output characteristics of the light receiving/emitting element 1100, and consequently, reducing the variation of properties of the optical device caused by the stress variation of the mold resin 1050.

The cavity 1041 disposed above the mesa structure portion 1201 can reduce the stress especially acting from above the mesa structure portion 1201 to the mesa structure portion 1201 and the semiconductor substrate 1010. In association with the stress variation of the mold resin 1050, the stress variation is transmitted from every direction to every direction such as the mold resin 1050 side and the semiconductor substrate 1010 side. However, since the cavity 1041 can reduce the stress from every direction, not only the influence on the light receiving/emitting element 1100 but also the influence on each portion of the optical device 1 can be reduced.

<Method for Controlling Cavity Position>

The cavity 1041 can be formed only on a desired position with higher accuracy by (1) selectively roughening the protective layer 1040 and (2) selectively covering the protective layer 1040 with a film having good adhesion with the mold resin 1050. Specifically, before forming the mold resin 1050, the surface of the protective layer 1040 is roughened or covered with the film having the good adhesion with the mold resin 1050 excluding a part (a part of the surface positioned at an upper side of the mesa structure portion 1201) to form the cavity 1041. On the roughened part or the part covered with the film having the good adhesion with the mold resin 1050 on the surface of the protective layer 1040, the adhesion of the protective layer 1040 with the mold resin 1050 improves, thus reducing the generation of the cavity 1041.

Figure 10A:
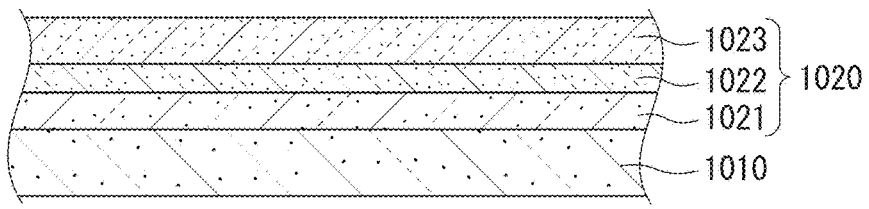
FIGS. 10A to 10E are cross-sectional process drawings describing an exemplary method for manufacturing a cavity.

(1) In the method where the protective layer 1040 is selectively roughened, first, as illustrated in FIG. 10A, on the semiconductor substrate 1010, the first conductivity-type semiconductor layer 1021, the intrinsic semiconductor layer 1022, and the second conductivity-type semiconductor layer 1023 are laminated in this order, thus forming the semiconductor lamination portion 1020. In FIG. 10A, the semiconductor lamination portion 1020 is formed to have the photodiode structure of the PIN junction formed of the first conductivity-type semiconductor layer 1021, the intrinsic semiconductor layer 1022, and the second conductivity-type semiconductor layer 1023.

Figure 10B:
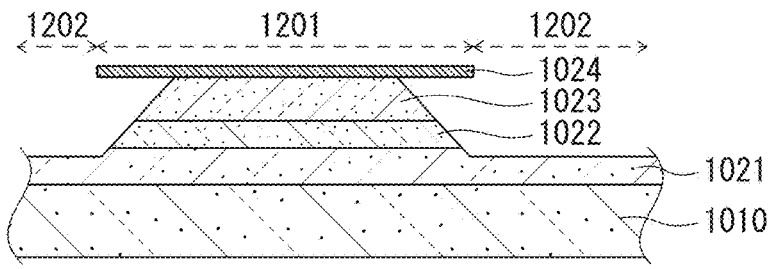

Next, the etching is partially performed on the semiconductor lamination portion 1020, thus forming the mesa structure portion 1201 and the bottom portion 1202 (FIG. 10B). In FIG. 10B, a resist 1024 is partially formed on the semiconductor lamination portion 1020, the wet etching is performed on the semiconductor lamination portion 1020 where the resist 1024 is partially disposed, thus forming the mesa structure portion 1201 on the semiconductor lamination portion 1020. Then, through the processes of element isolation by ion milling, forming a contact hole, and forming an electrode pattern, the light receiving/emitting element 1100 is formed.

Figure 10C:
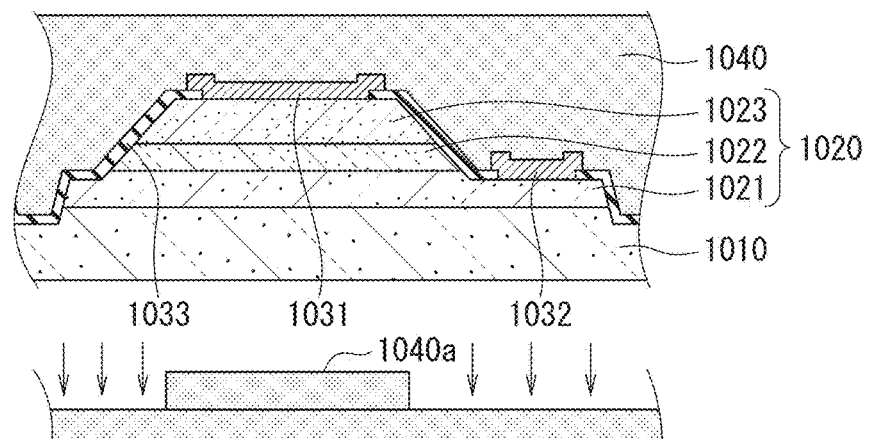

Next, the protective layer 1040 is formed on the light receiving/emitting element 1100 (FIG. 10C). The process for forming the protective layer 1040 may be appropriately executed corresponding to the material used for the protective layer. For example, when a photosensitive protective layer is used as the protective layer 1040, a rotary coater is used for applying the protective layer over the light receiving/emitting element 1100, and baking is performed. After that, exposure is performed with g-line or i-line of a mercury lamp, developing is performed, patterning is performed, and subsequently, heating process is performed to cure. The protective layer 1040 configured to have an appropriate film thickness ensures generating a desired cavity due to the effect of the stress. Therefore, the appropriate film thickness is selected at the portion of the mesa structure portion 1201 so as to preferentially generate the cavity.

Figure 10D:
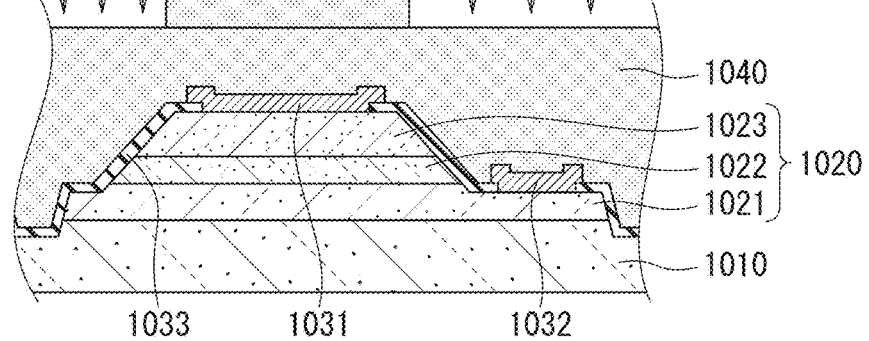

Next, a resist 1040a is partially formed on the protective layer 1040 (FIG. 10D). At this time, the resist 1040a is formed only on the region above the mesa structure portion 1201 and not formed on the region above the bottom portion 1202.

The resist 1040a may be formed by using a common semiconductor processing similarly to the case of forming the resist 1024. As the resist 1040a, metal or resin may be employed.

Then, the region where the resist 1040a is not formed, that is, the region (the region above the bottom portion 1202) excluding the region above the mesa structure portion 1201 is roughened. For example, $O_2$ plasma RIE is performed for roughening.

Next, after removing the resist 1040a, the wafer after roughening is individualized into chips by dicing, thus obtaining the light receiving/emitting element 1100 that includes the protective layer 1040 where a part of the surface is roughened.

Subsequently, on an adhesive tape (not illustrated), a lead frame (not illustrated) that has an opening and later formed as the terminal portions 1060, and the light receiving/emitting element 1100 are placed such that the light receiving/emitting element 1100 is positioned on the center of the opening of the lead frame. Then, for example, the Au wire 1070 is bonded so as to connect the electrode 1031 of the light receiving/emitting element 1100 to the lead frame and connect the electrode 1032 of the light receiving/emitting element 1100 to the lead frame. Finally, the adhesive tape where the respective components are laminated is placed on a lower mold (not illustrated) that has a depressed portion whose thickness is identical to a sum of thicknesses of an adhesive sheet and the lead frame, and an upper mold (not illustrated) is pressed against the lower mold with a desired pressure. The molten resin is poured into the space between the lower mold and the upper mold and cooled, thus forming the mold resin 1050. It is only necessary that the curing of the mold resin 1050 is performed at a temperature higher than a temperature of any glass transition point of the material of the protective layer 1040 and the material of the mold resin 1050, and preferably, the mold resin 1050 is returned into a room temperature immediately after termination of heating because cooling proceeds the generation of the cavity 1041 due to the stress.

Here, in the roughened region above the bottom portion 1202, since the adhesion of the mold resin 1050 with the protective layer 1040 improves, the cavity 1041 is less likely to be generated. Consequently, the cavity 1041 is formed only in the not roughened region above the mesa structure portion 1201.

Then, at this time, a mold that includes a protrusion for forming the through hole 1051 on a position facing the cavity 1041 is used as the upper mold as described with FIG. 4C in the first embodiment, a sheet made of, for example, Teflon (registered trademark) is disposed so as to cover the entire surface on the side where the protrusion is formed, and this upper mold is used to fill the molten resin.

Figure 10E:
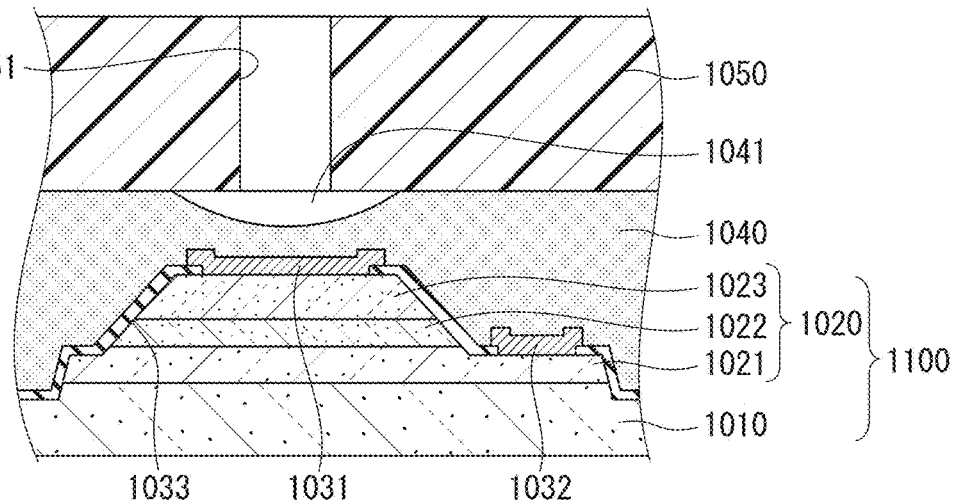

Accordingly, as illustrated in FIG. 10E, the through hole 1051 communicated with the cavity 1041 is formed on the position facing the cavity 1041 of the mold resin 1050.

Next, the mold resin 1050 is extracted from the lower mold and the upper mold, and a dicing tape (not illustrated) is laminated on the surface after removing the adhesive tape. Finally, a dicing blade is used for cutting the lead frame portion from the surface on the opposite side of the surface where the dicing tape is laminated. Then, the individualized optical device (the optical device illustrated in FIG. 8) is obtained.

(2) In the method where the protective layer 1040 is selectively covered with the film having the good adhesion with the mold resin 1050, the light receiving/emitting element 1100 that includes the protective layer 1040 is formed with the procedure similar to the above description (FIGS. 11A to 11C).

Next, the protective layer 1040 is selectively covered with an adhesive film 1040b, such as polyimide resin, having the good adhesion with the mold resin 1050 (FIG. 11D). At this time, the adhesive film 1040b is formed only on the region above the bottom portion 1202 and not formed on the region above the mesa structure portion 1201.

Then, with the procedure similar to the above description, the upper mold that includes the protrusion for forming the through hole 1051 communicated with the cavity 1041 on the position facing the cavity 1041 is used, and the upper mold where the sheet made of, for example, Teflon (registered trademark) is disposed so as to cover the entire surface on the side where the protrusion is formed is used to fill the molten resin, thus sealing the light receiving/emitting element 1100 by the mold resin 1050 via the protective layer 1040 (FIG. 11E).

Here, in the region, where the adhesive film 1040b is formed, above the bottom portion 1202, the adhesion of the adhesive film 1040b with the mold resin 1050 improves. On the other hand, in the region, where the adhesive film 1040b is not formed, above the mesa structure portion 1201, since the adhesion of the adhesive film 1040*b* with the mold resin 1050 is low, the cavity 1041 is easily generated. Consequently, the cavity 1041 is formed only above the mesa structure portion 1201. Furthermore, since the upper mold includes the protrusion for forming the through hole 1051, the through hole 1051 communicated with the cavity 1041 is formed on the position facing the cavity 1041.

The method that selectively roughens the protective layer 1040 may be combined with the method that selectively covers the protective layer 1040 with the film having the good adhesion such that, by roughening only the region where the cavity 1041 is formed on the protective layer 1040 and disposing the adhesive film 1040*b* only on the region where the cavity 1041 is not formed on the protective layer 1040, the adhesion of the protective layer 1040 with the mold resin 1050 is improved via the adhesive film 1040*b* and the adhesion of the protective layer 1040 with the adhesive film 1040*b* is also improved.

<Modification>

In the above-described third embodiment, as illustrated in FIG. 8, one cavity 1041 may be partially formed above the mesa structure portion 1201 for each mesa structure portion 1201, while a plurality of the cavities 1041 may be formed for one mesa structure portion 1201.

The cavity 1041 is not necessarily required to be disposed for every mesa structure portion 1201, and the cavity 1041 may be disposed for only any one of or a plurality of the mesa structure portions 1201.

Figure 12:
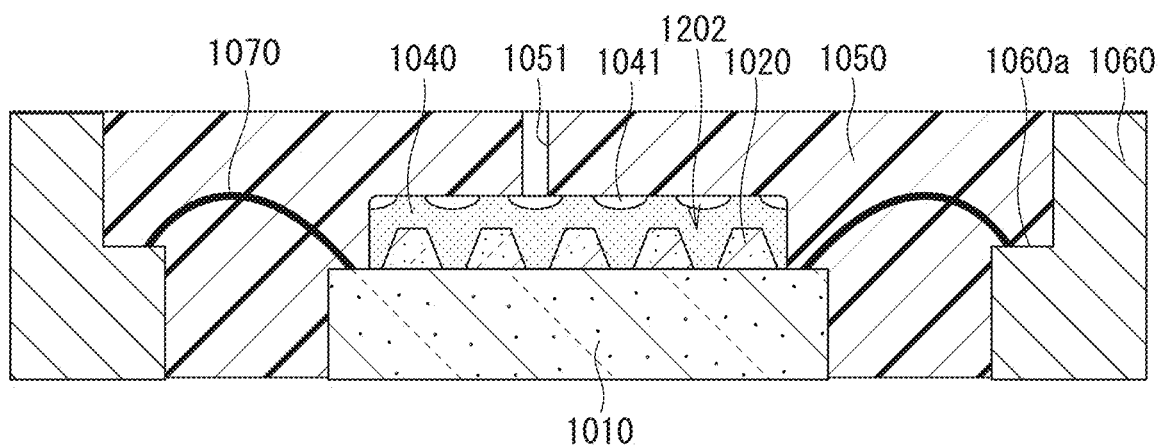
FIG. 12 is a cross-sectional view illustrating a schematic configuration of a modification of the optical device according to the third embodiment.

In FIG. 8, one cavity 1041 or a plurality of the cavities 1041 may be disposed not only above the mesa structure portion 1201 but also partially above the bottom portion 1202. As illustrated in FIG. 12, the cavity 1041 may be disposed only above the bottom portion 1202. In this case, the cavity 1041 has the thickness of 2 μm or more and 200 μm or less. That is, the cavity 1041 may be disposed on any region between the protective layer 1040 and the mold resin 1050.

Figure 13:
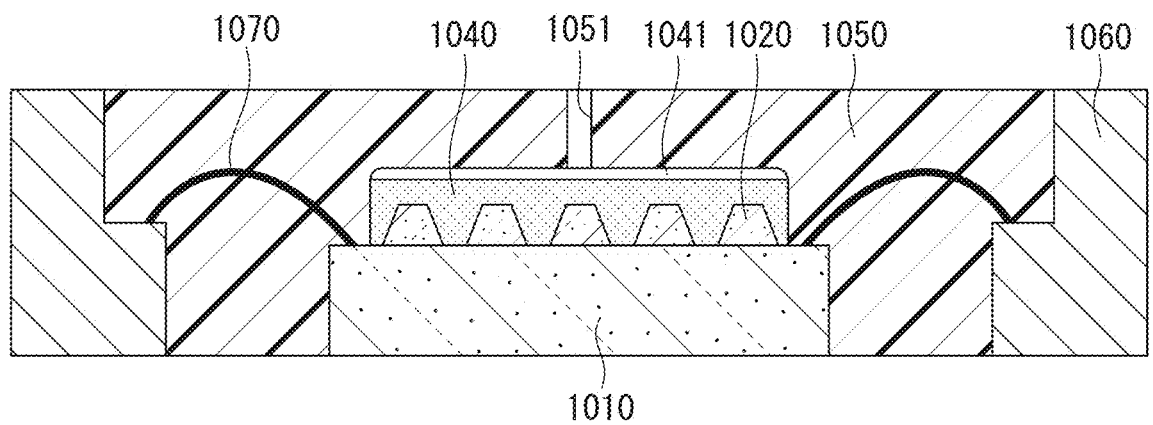
FIG. 13 is a cross-sectional view illustrating a schematic configuration of a modification of the optical device according to the third embodiment.

As illustrated in FIG. 13, the cavity 1041 may be formed so as to be overlapped with the entire surface (that is, the whole region between the protective layer 1040 and the mold resin 1050) of the protective layer 1040 in top view. In the case where a plurality of the light receiving/emitting elements 1100 are connected in series or in parallel and similar case, the protective layer 1040 may be formed so as to cover the whole of the plurality of the light receiving/emitting elements 1100 or cover the entire light receiving/emitting element 1100, thus forming the cavity 1041 over the entire protective layer 1040. In this case again, from the aspect of reducing the influence of the stress of the mold resin 1050, the cavity 1041 is preferred to have the thickness of 2 μm or more and 200 μm or less from the uppermost portion of the mesa structure portion 1201.

Thus, the cavity 1041 formed over the entire protective layer 1040 ensures more reducing the influence of the stress variation of the mold resin 1050.

Figure 14:
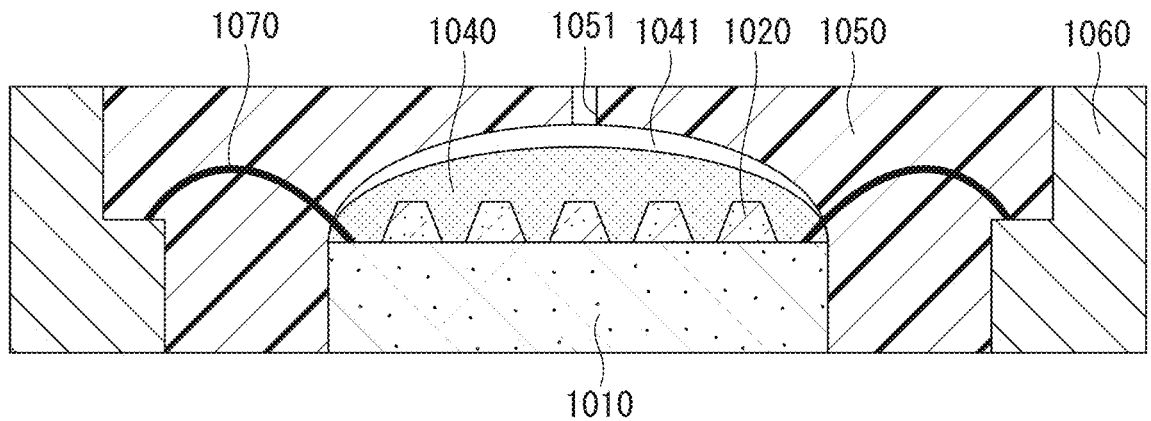
FIG. 14 is a cross-sectional view illustrating a schematic configuration of a modification of the optical device according to the third embodiment.

Furthermore, as illustrated in FIG. 14, the protective layer 1040 and the cavity 1041 may be formed to have the hemispherical surfaces. That is, for example, a potting method may be used for dropping the protective layer 1040 to form the protective layer 1040 that has the hemispherical surface, and on this protective layer 1040, the mold resin 1050 is formed so as to form the cavity 1041 having the hemispherical surface. In this case again, the operational advantage equivalent to the above description can be obtained.

In this case again, from the aspect of reducing the influence of the stress of the mold resin 1050, the cavity 1041 is preferred to have the thickness of 2 μm or more and 200 μm or less from the uppermost portion of the mesa structure portion 1201. In this case, the uppermost portion of the light receiving/emitting element 1100 predicted to be arranged on a position closest to the edge portion of the hemispherical protective layer 1040 may be defined as the uppermost portion of the mesa structure portion 1201.

Then, the through hole 1051, which passes through the mold resin 1050 to reach the cavity 1041, only needs to be disposed for each cavity 1041 disposed on each position illustrated in FIGS. 12 to 14.

For simplification, FIGS. 12 to 14 illustrate only main parts.

Thus, even the cavity 1041 that has a different shape or is disposed on a different location can provide the operational advantage equivalent to the third embodiment.

In the above-described first to third embodiments, when the protective layer is made of the material that can sufficiently reduce the influence of the stress variation caused by the deformation of the mold resin, the through hole may be disposed on any position of the mold resin. For example, the through hole may be disposed on a region overlapped with the protective layer in top view, may be disposed on a region not overlapped with the protective layer in top view, or may be disposed on a region not overlapped with the substrate.

Next, a fourth embodiment of the present invention will be described.

An optical device 1 according to the fourth embodiment is an exemplary optical device where a protective layer is made of a material that can sufficiently reduce the influence of the stress variation caused by the deformation of the mold resin.

Figure 15:
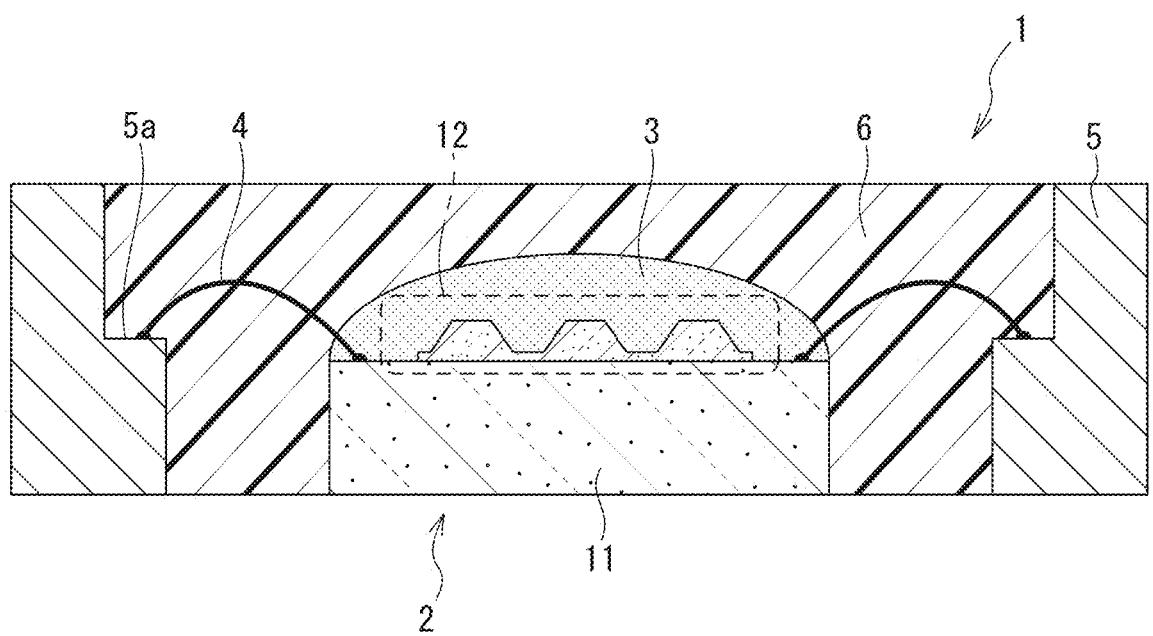
FIG. 15 is a cross-sectional view illustrating a schematic configuration of an optical device according to a fourth embodiment.

As illustrated in FIG. 15, the optical device 1 according to the fourth embodiment includes the mold resin 6 without the through hole 61 in the optical device 1 of the first embodiment illustrated in FIG. 1. The optical device 1 according to the fourth embodiment is similar to the optical device 1 in the first embodiment excluding that the through hole 61 is not formed on the mold resin 6. Then, like reference numerals designate corresponding or identical elements, and therefore such elements will not be further elaborated here.

That is, as illustrated in FIG. 15, the optical device 1 according to the fourth embodiment includes the light receiving/emitting element 2 that has the photoelectric conversion function, the protective layer 3, and the terminal portion 5 connected to the light receiving/emitting element 2 by the wire 4 connected to the wire pad (not illustrated) of the light receiving/emitting element 2. The light receiving/emitting element 2 includes the substrate 11 and the active portion 12 formed on the substrate 11. The protective layer 3 is continuously formed to cover the active portion 12 and to cover at least a part of the substrate 11. The protective layer 3 is formed to have a thickness increasing toward the center of the substrate 11. The mold resin 6 is gaplessly filled on the whole between the terminal portion 5 and the light receiving/emitting element 2.

The protective layer 3 only needs to be disposed to cover at least entire surface of the active portion 12, and is not necessarily required to cover the substrate 11.

A method for manufacturing the optical device 1 in the fourth embodiment will be described by referring to cross-sectional views illustrated in FIGS. 16A to 16D.

First, the wafer dicing process is performed to individualize the substrate 11 from a state of a wafer into chips of the light receiving/emitting element 2.

Figure 16A:
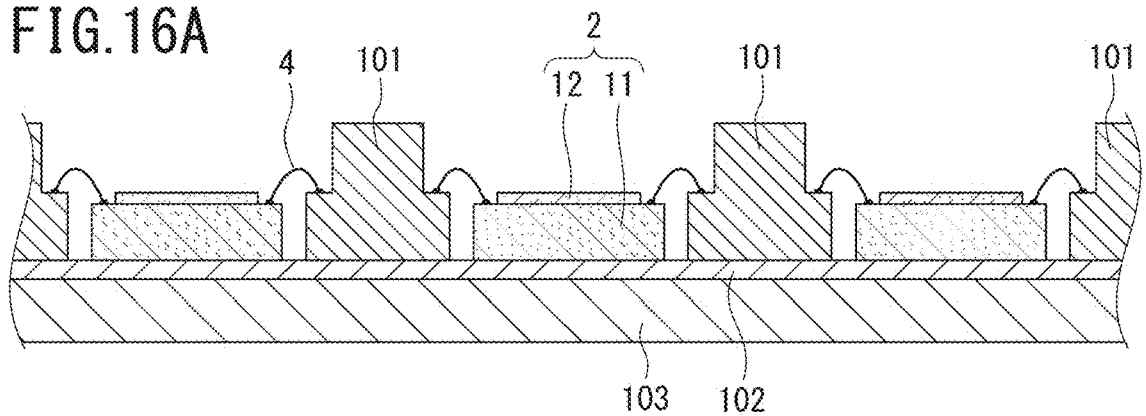
FIGS. 16A to 16D are exemplary cross-sectional views describing manufacturing processes of the optical device according to the fourth embodiment.

Next, a plurality of the individualized semiconductor chips 2 are fixed on the adhesive sheet 102 where the lead frames 101, which are formed as the terminal portions 5 later, are fixed, and the wire bonding process is performed to electrically connect the semiconductor chip 2 to the terminal portion 5 by the wire 4 (FIG. 16A). The adhesive sheet 102 may be preliminarily included on the lead frame 101.

Figure 16B:
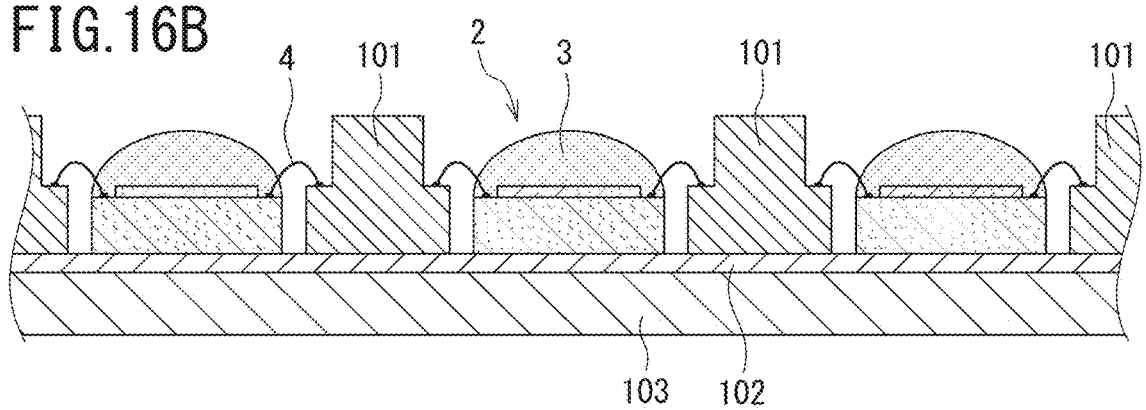

Next, a potting process is performed to form the protective layer 3 (FIG. 16B). That is, a resin for forming the protective layer 3 is dropped on the substrate 11 so as to cover the entire surface of the active portion 12 of the semiconductor chip 2. Then, a shape of the dropped resin is held as it is to form the protective layer 3. This forms the protective layer 3 having the thickness increased toward the center of the substrate 11. In the resin potting process, a dispenser device for liquid resin may be used.

Figure 16C:
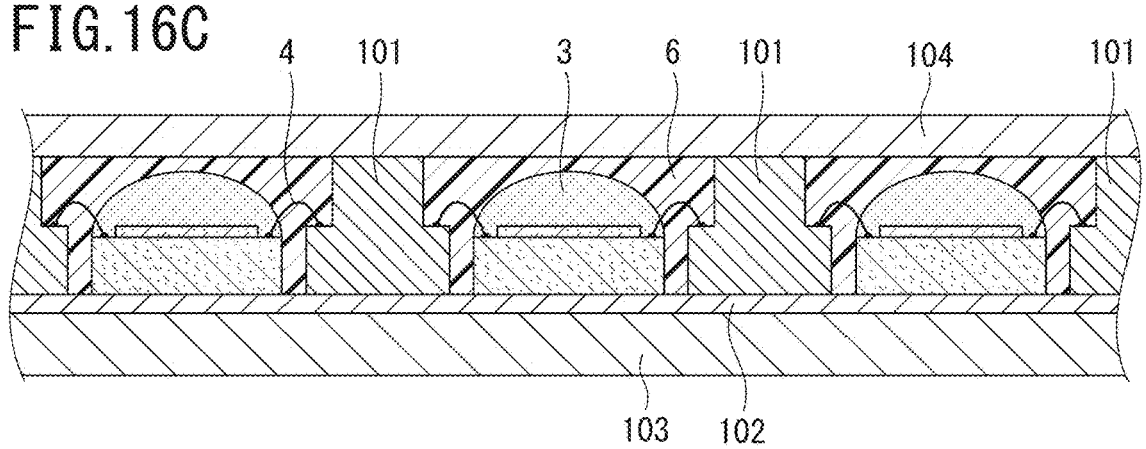

Next, the transfer molding is performed by using an upper mold 104, where protrusions are not formed on a surface facing a lower mold 103, to form the mold resin (FIG. 16C). That is, the upper mold 104 is positioned to contact the terminal portion 5 so as to face the lower mold 103, and the molten resin is filled between the upper mold 104 and the adhesive sheet 102 from a side. Before the process performing the transfer molding, a process to cure the protective layer 3 may be provided.

Figure 16D:
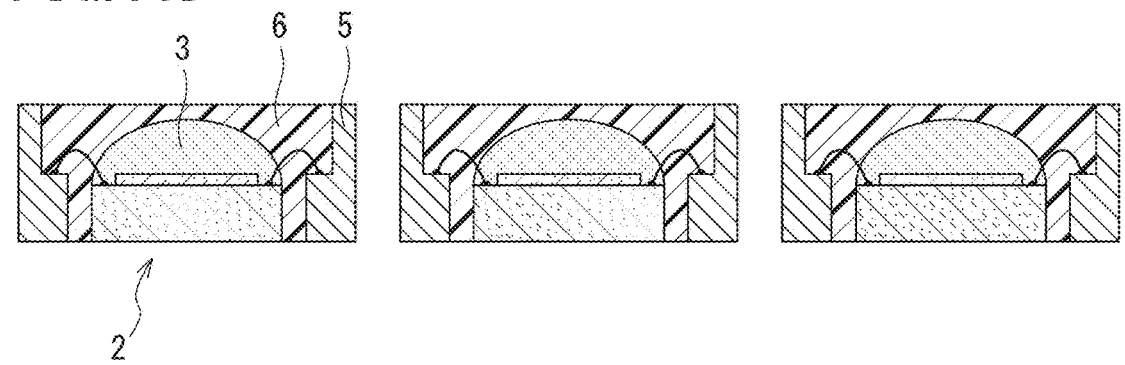

Next, the upper mold 104 and the lower mold 103 are removed and the filled mold resin 6 is cured. Then, an individualization process (the dicing process) is performed to individualize the substrates 11 (FIG. 16D).

Here, when the resin for forming the protective layer 3 is dropped on the substrate 11 so as to cover the entire surface of the semiconductor lamination portion 21 on the semiconductor chip 2, the resin has a hemispherical cross section as illustrated in FIG. 16B. That is, the protective layer 3 formed while holding this state has the thickness increased toward the center.

Figure 17:
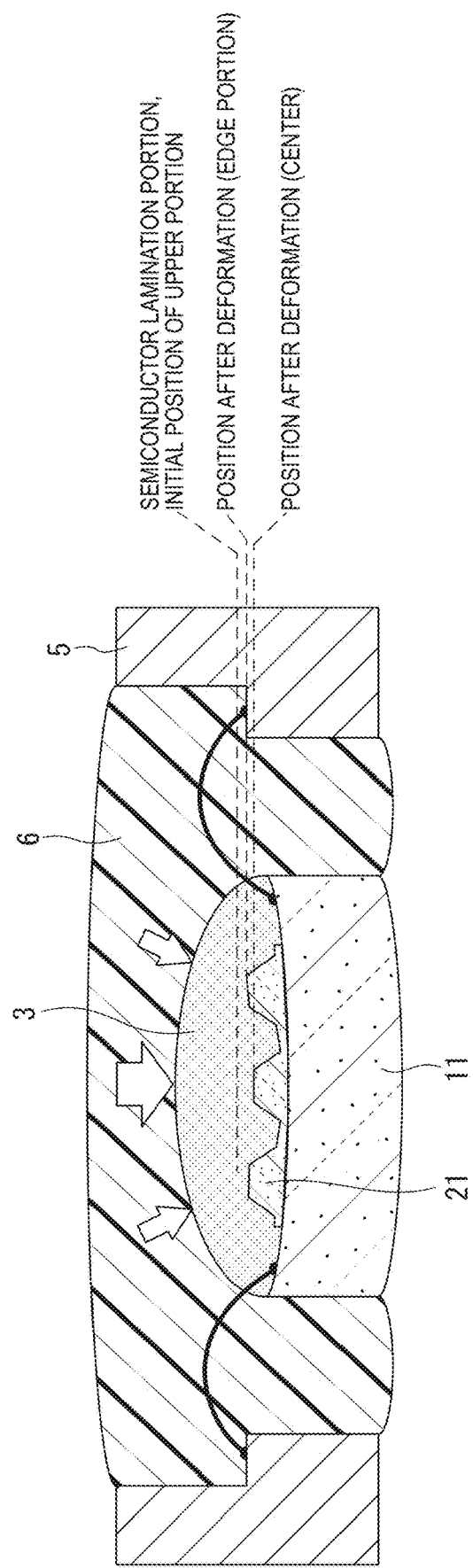
FIG. 17 is an explanatory drawing used for describing operations of the optical device according to the fourth embodiment.

In the optical device 1 where the protective layer 3 is formed to have the hemispherical cross section as illustrated in FIG. 1, when a state where the mold resin 6 is in a dry state and the stress variation does not occur has changed to a state where the mold resin 6 is swollen, for example, as illustrated in FIG. 17, the mold resin 6 expands most at the position of the center of the substrate 11. Therefore, when the protective layer 3 is not disposed, the center of the substrate 11 is significantly curved and the center of the substrate 11 is depressed. The deformation of the substrate 11 causes variation of the position of the semiconductor lamination portion 21 formed on the substrate 11, that is, a relative position of the semiconductor lamination portion 21 to the terminal portion 5. Since the center of the substrate 11 is depressed, the variation amount of the relative position of the semiconductor lamination portion 21 to the terminal portion 5 significantly varies as the semiconductor lamination portion 21 is positioned close to the center of the substrate 11.

Here, the protective layer 3 is disposed on the substrate 11 so as to cover the entire surface of the semiconductor lamination portion 21 and the protective layer 3 has the thickness increased toward the center of the substrate 11.

Therefore, the protective layer 3 acts so as to more reduce the deformation of the mold resin 6 on the substrate center compared with the edge portion, thus reducing the deformation of the substrate 11. Consequently, the amount of variation of the semiconductor lamination portion 21 is lowered. That is, the influence on the optical device 1 can be reduced in accordance with the stress variation of the mold resin 6, thus ensuring the reduction of variation in property caused by the influence of the mold resin 6 on the optical device 1.

In the case of the optical device 1 illustrated in FIG. 15, similarly to the optical device 1 illustrated in FIG. 1, the active portion 12 includes a plurality of the semiconductor lamination portions 21 electrically connected to one another. This achieves a high SNR and improves adhesion due to the enlarged contacted area with the protective layer 3.

While the above-described protective layer 3 is formed mainly for reducing the variation in the electric property of the optical device 1 caused by the stress, the protective layer 3 is required not to reduce the variation in the electric property of the optical device 1 but to obtain desired variation in the electric property depending on usage. When the desired variation in the electric property is required, the protective layer 3 may be formed with desired resin amount. This preferably ensures controlling a relation between the resin deformation and the electric property of the optical device 1 in the protective layer formation process.

Next, a fifth embodiment of the present invention will be described.

An optical device 1 according to the fifth embodiment is an exemplary optical device where a protective layer is made of a material that can sufficiently reduce the influence of the stress variation caused by the deformation of the mold resin in the optical device according to the second embodiment.

Figure 18:
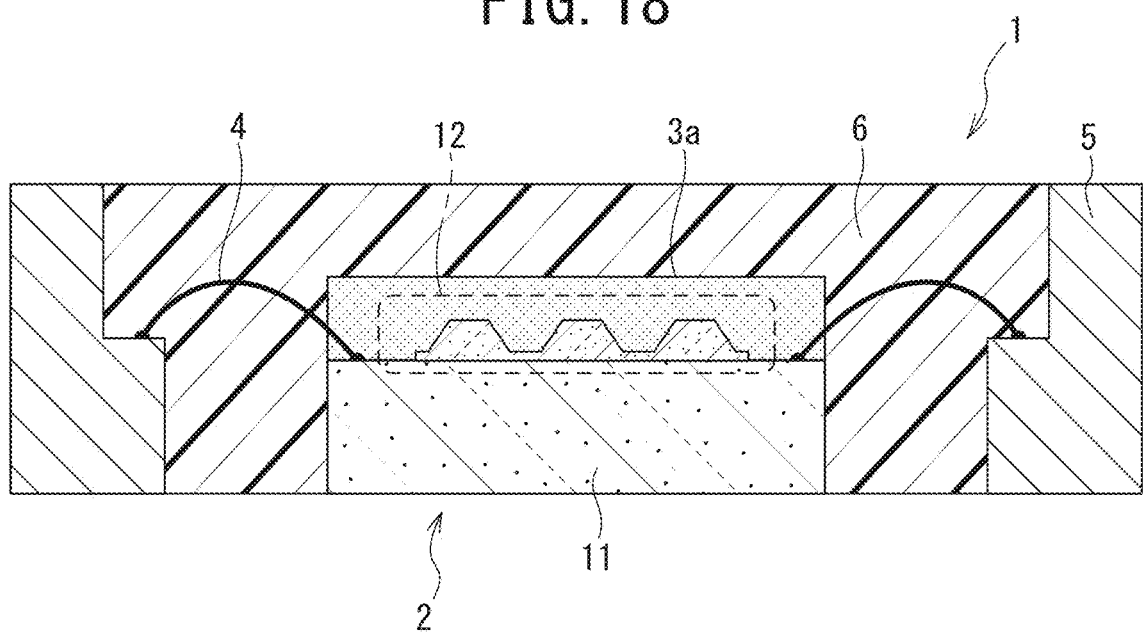
FIG. 18 is a cross-sectional view illustrating a schematic configuration of an optical device according to a fifth embodiment.

As illustrated in FIG. 18, the optical device 1 according to the fifth embodiment includes the mold resin 6 without the through hole 61 in the optical device 1 of the second embodiment illustrated in FIG. 7. The optical device 1 according to the fifth embodiment is similar to the optical device 1 in the second embodiment excluding that the through hole 61 is not formed on the mold resin 6. In this case, similarly to the second embodiment, disposing the protective layer 3 ensures reducing the deformation of the substrate 11 caused by the stress variation of the mold resin 6, thus ensuring the reduction of the variation amount of the semiconductor lamination portion 21, that is, ensuring the reduction of the variation in property caused on the optical device 1.

Next, a sixth embodiment of the present invention will be described.

Figure 19:
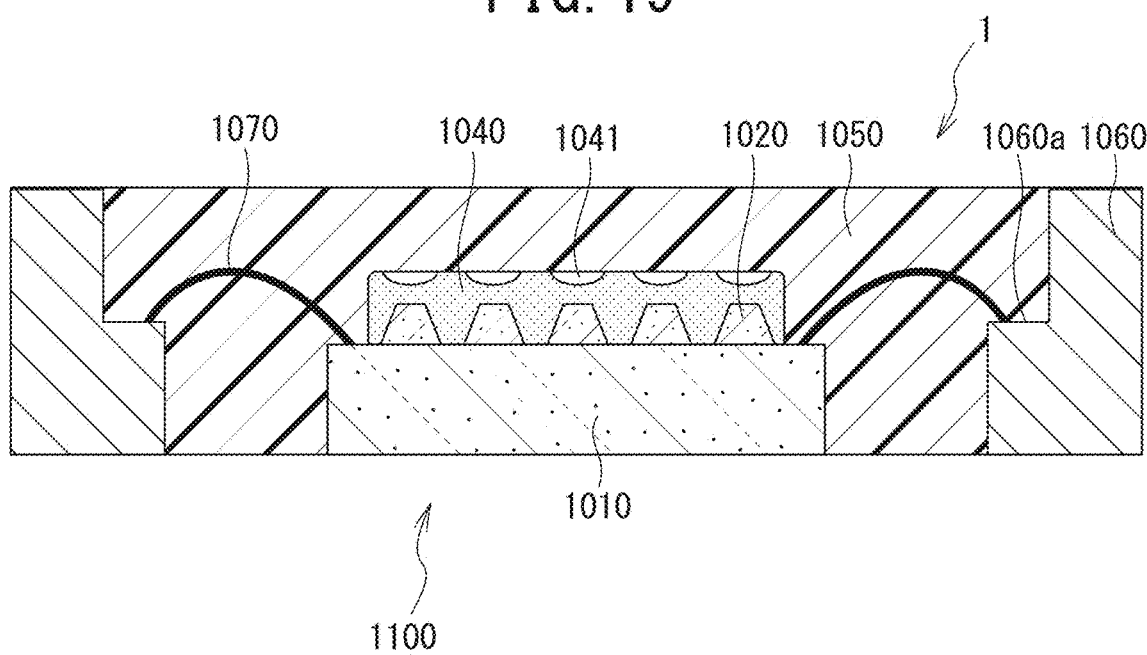
FIG. 19 is a cross-sectional view illustrating a schematic configuration of an optical device according to a sixth embodiment.
Figure 20:
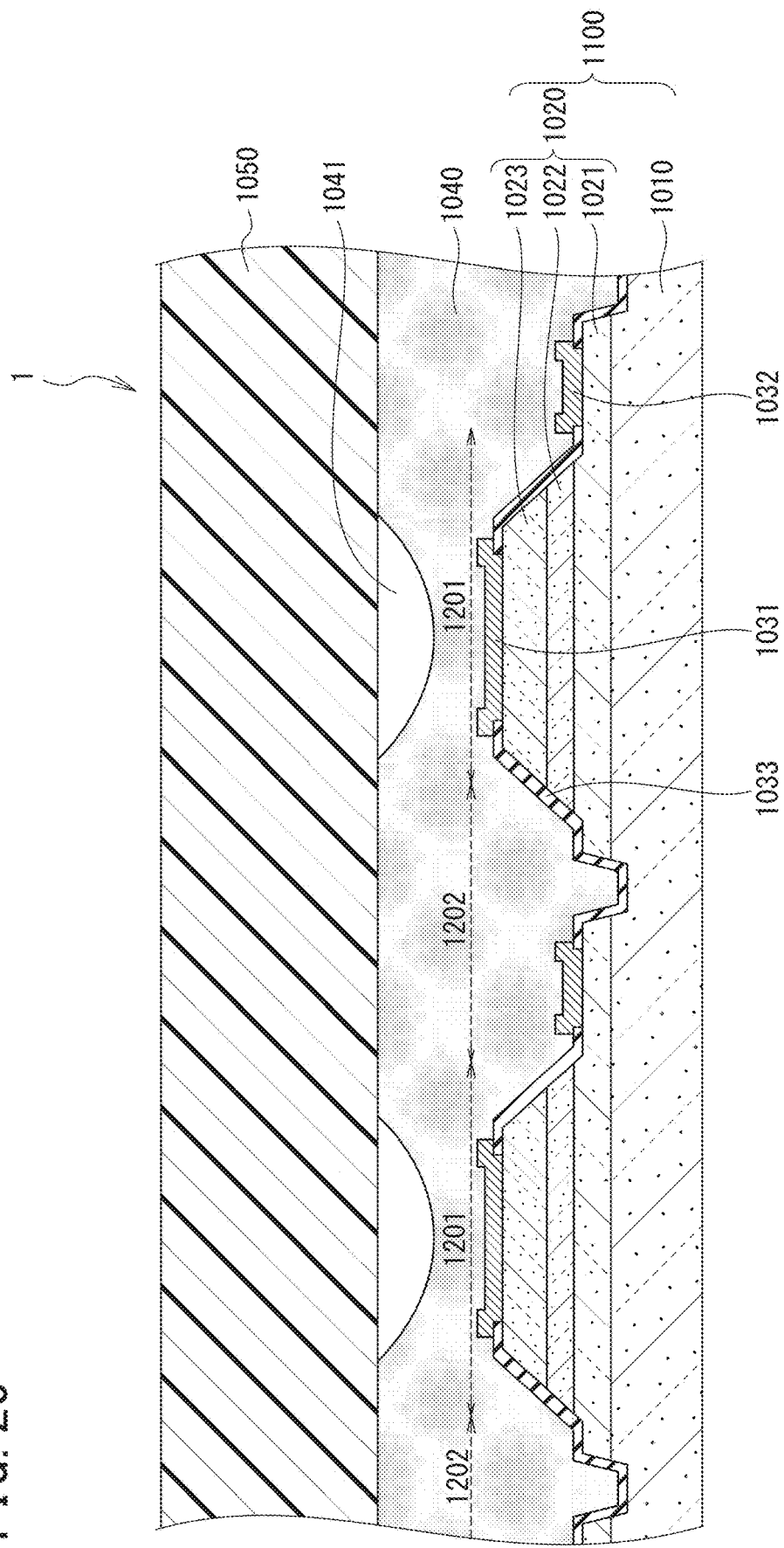
FIG. 20 is a cross-sectional configuration diagram illustrating an exemplary detail of a main part of FIG. 19.

As illustrated in FIGS. 19 and 20, an optical device 1 according to the sixth embodiment includes the mold resin 1050 without the through hole 1051 in the optical device 1 of the third embodiment where the cavity is disposed between the mold resin and the protective layer illustrated in FIG. 8. The optical device 1 according to the sixth embodiment is similar to the optical device 1 in the third embodiment excluding that the through hole 1051 is not formed on the mold resin 1050. Then, like reference numerals designate corresponding or identical elements, and therefore such elements will not be further elaborated here.

The control method for the shape of the cavity 1041 of the optical device 1 according to the sixth embodiment is similar to the optical device 1 in the third embodiment. The control method for the position of the cavity 1041 is also similar to the optical device 1 in the third embodiment, while the upper mold used for forming the mold resin 1050 has a different shape.

That is, in the method (1) where the protective layer 1040 is selectively roughened, as illustrated in FIGS. 21A to 21E, the processes similar to the optical device 1 in the third embodiment are performed from FIGS. 21A to 21D, thus obtaining the light receiving/emitting element 1100 that includes the protective layer 1040 where apart of the surface is roughened.

Subsequently, on an adhesive tape (not illustrated), a lead frame (not illustrated) that has an opening and later formed as the terminal portions 1060, and the light receiving/emitting element 1100 are placed such that the light receiving/emitting element 1100 is positioned on the center of the opening of the lead frame. Then, for example, the Au wire 1070 is bonded so as to connect the electrode 1031 of the light receiving/emitting element 1100 to the lead frame and connect the electrode 1032 of the light receiving/emitting element 1100 to the lead frame. Finally, the adhesive tape where the respective components are laminated is placed on a lower mold (not illustrated) that has a depressed portion whose thickness is identical to a sum of thicknesses of an adhesive sheet and the lead frame, and an upper mold (not illustrated) without the protrusion for forming the through hole is used to press against the lower mold with a desired pressure. The molten resin is poured into the space between the lower mold and the upper mold and cooled, thus forming the mold resin 1050. The curing of the mold resin 1050 is simply performed at a temperature higher than a temperature of any glass transition point of the material of the protective layer 1040 or the material of the mold resin 1050, and preferably, the mold resin 1050 is returned into a room temperature immediately after termination of heating because cooling proceeds the generation of the cavity 1041 due to the stress.

Here, in the roughened region above the bottom portion 1202, since the adhesion of the mold resin 1050 with the protective layer 1040 improves, the cavity 1041 is less likely to be generated. Consequently, the cavity 1041 is formed only in the not roughened region above the mesa structure portion 1201.

Next, the mold resin 1050 is extracted from the lower mold and the upper mold, and a dicing tape (not illustrated) is laminated on the surface after removing the adhesive tape. Finally, a dicing blade is used for cutting the lead frame portion from the surface on the opposite side of the surface where the dicing tape is laminated. Then, the individualized optical device 1 is obtained.

In the sixth embodiment, the protrusion is not formed on the surface of the upper mold facing the lower mold. Then, as illustrated in FIG. 21E, the mold resin 1050 does not include the through hole.

In the method (2) where the protective layer 1040 is selectively covered with the film having the good adhesion with the mold resin 1050, as illustrated in FIGS. 22A to 22E, the processes similar to the optical device 1 in the third embodiment are performed from FIGS. 22A to 22D, thus obtaining the protective layer 1040 covered with the adhesive film 1040b, such as polyimide resin, having the good adhesion with the mold resin 1050.

Figure 22A:
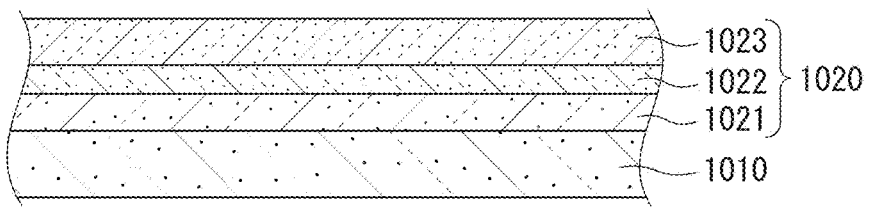
FIGS. 22A to 22E are cross-sectional process drawings describing the other example of the method for manufacturing the cavity.
Figure 22B:
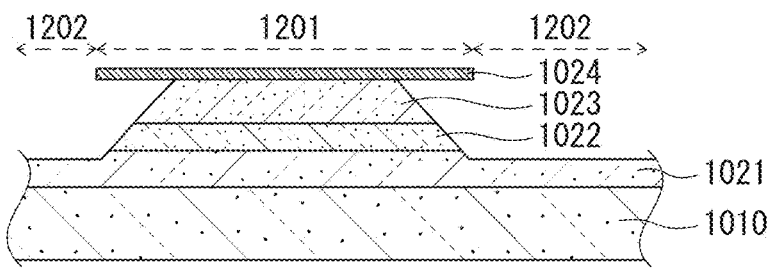
Figure 22C:
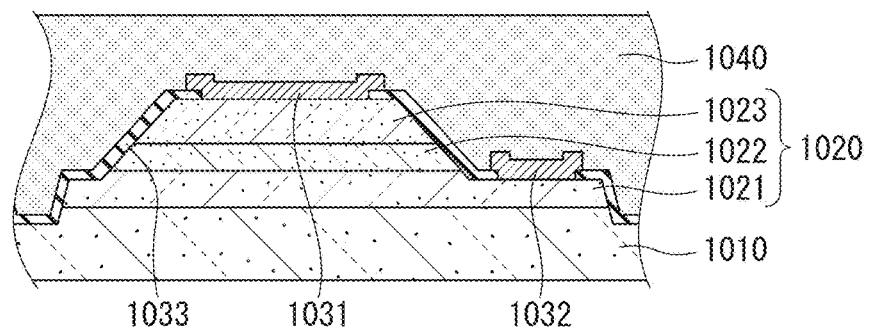
Figure 22D:
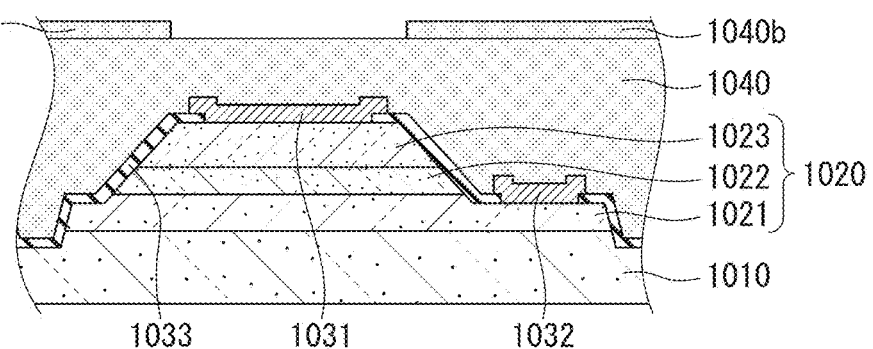
Figure 22E:
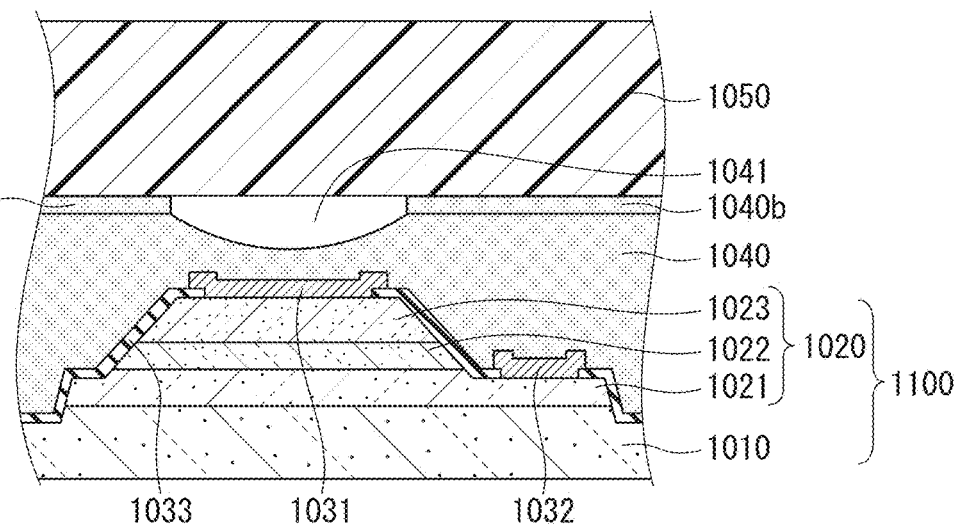

Then, with the procedure similar to the case (1) where the protective layer 1040 is selectively roughened, the upper mold (not illustrated) without the protrusion for forming the through hole is used to seal the light receiving/emitting element 1100 by the mold resin 1050 via the protective layer 1040 (FIG. 22E).

Here, in the region, where the adhesive film 1040b is formed, above the bottom portion 1202, the adhesion of the adhesive film 1040b with the mold resin 1050 improves. On the other hand, in the region, where the adhesive film 1040b is not formed, above the mesa structure portion 1201, since the adhesion of the adhesive film 1040b with the mold resin 1050 is low, the cavity 1041 is easily generated. Consequently, the cavity 1041 is formed only above the mesa structure portion 1201.

In this case again, the method that selectively roughens the protective layer 1040 may be combined with the method that selectively covers the protective layer 1040 with the film having the good adhesion such that, by roughening only the region where the cavity 1041 is formed on the protective layer 1040 and disposing the adhesive film 1040b only on the region where the cavity 1041 is not formed on the protective layer 1040, the adhesion of the protective layer 1040 with the mold resin 1050 is improved via the adhesive film 1040b and the adhesion of the protective layer 1040 with the adhesive film 1040b is also improved.

<Modification>

In the above-described sixth embodiment, as illustrated in FIG. 19, one cavity 1041 may be partially formed above the mesa structure portion 1201 for each mesa structure portion 1201, while a plurality of the cavities 1041 may be formed for one mesa structure portion 1201.

The cavity 1041 is not necessarily required to be disposed for every mesa structure portion 1201, and the cavity 1041 may be disposed for only any one of or a plurality of the mesa structure portions 1201.

Figure 23:
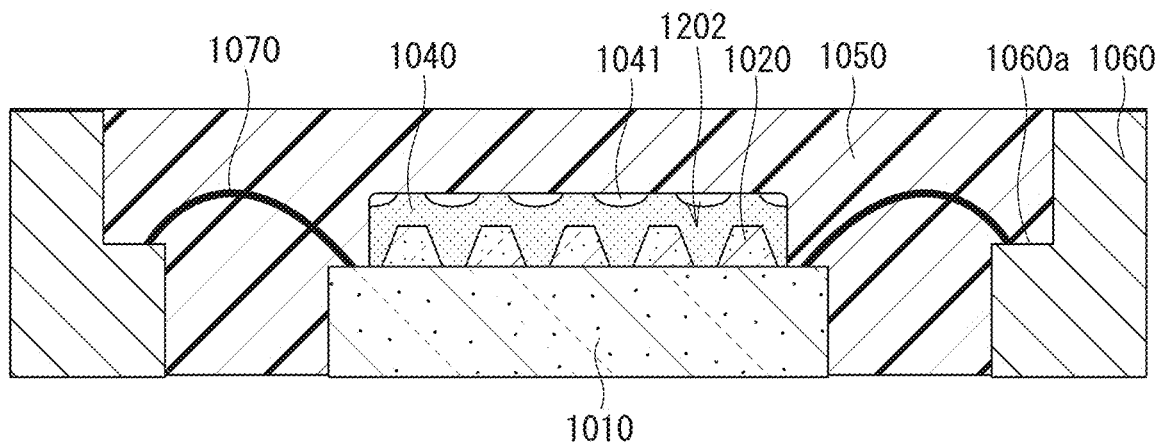
FIG. 23 is a cross-sectional view illustrating a schematic configuration of a modification of the optical device according to the sixth embodiment.

In FIG. 19, one cavity 1041 or a plurality of the cavities 1041 may be disposed not only above the mesa structure portion 1201 but also partially above the bottom portion 1202. As illustrated in FIG. 23, the cavity 1041 may be disposed only above the bottom portion 1202. In this case, the cavity 1041 has the thickness of 2 μm or more and 200 μm or less. That is, the cavity 1041 may be disposed on any region between the protective layer 1040 and the mold resin 1050.

Figure 24:
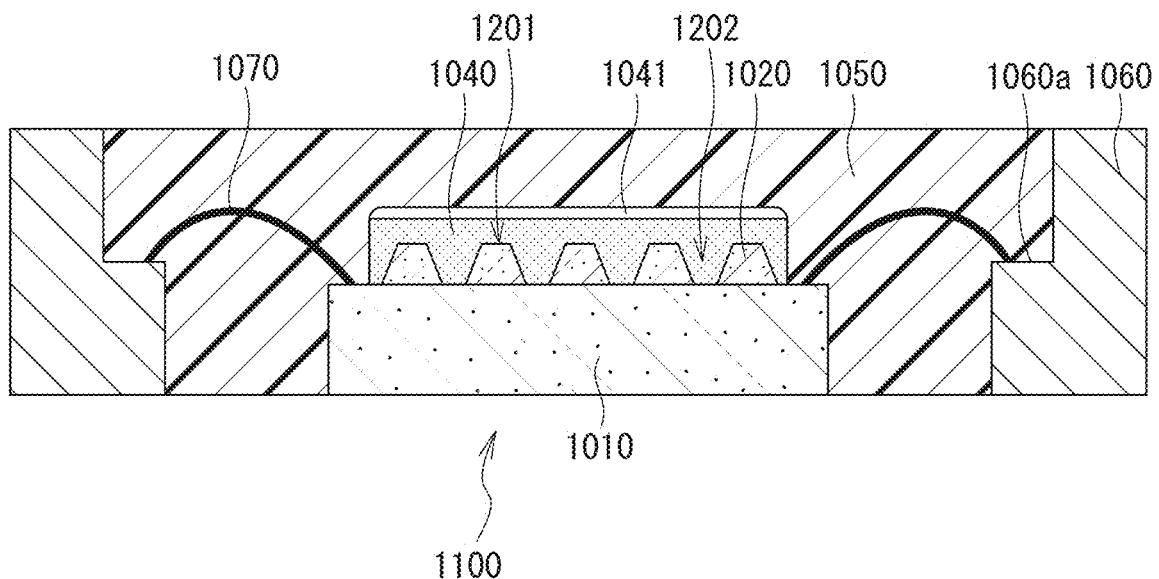
FIG. 24 is a cross-sectional view illustrating a schematic configuration of a modification of the optical device according to the sixth embodiment.

As illustrated in FIG. 24, the cavity 1041 may be formed so as to be overlapped with the entire surface (that is, the whole region between the protective layer 1040 and the mold resin 1050) of the protective layer 1040 in top view. In the case where a plurality of the light receiving/emitting elements 1100 are connected in series or in parallel and similar case, the protective layer 1040 may be formed so as to cover the whole of the plurality of the light receiving/emitting elements 1100, or cover the entire light receiving/emitting element 1100, thus forming the cavity 1041 over the entire protective layer 1040. In this case again, from the aspect of reducing the influence of the stress of the mold resin 1050, the cavity 1041 is preferred to have the thickness of 2 μm or more and 200 μm or less from the uppermost portion of the mesa structure portion 1201.

Thus, the cavity 1041 formed over the entire protective layer 1040 ensures more reducing the influence of the stress variation of the mold resin 1050.

Figure 25:
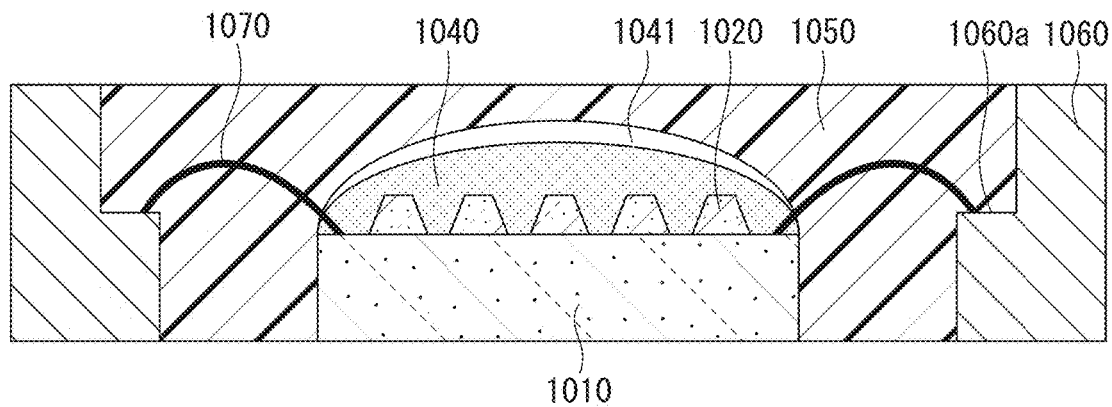
FIG. 25 is a cross-sectional view illustrating a schematic configuration of a modification of the optical device according to the sixth embodiment.

Furthermore, as illustrated in FIG. 25, the protective layer 1040 and the cavity 1041 may be formed to have the hemispherical surfaces. That is, for example, a potting method may be used for dropping the protective layer 1040 to form the protective layer 1040 that has the hemispherical surface, and on this protective layer 1040, the mold resin 1050 is formed so as to form the cavity 1041 having the hemispherical surface. In this case again, the operational advantage equivalent to the above description can be obtained.

In this case again, from the aspect of reducing the influence of the stress of the mold resin 1050, the cavity 1041 is preferred to have the thickness of 2 μm or more and 200 μm or less from the uppermost portion of the mesa structure portion 1201. In this case, the uppermost portion of the light receiving/emitting element 1100 predicted to be arranged on a position closest to the edge portion of the hemispherical protective layer 1040 may be defined as the uppermost portion of the mesa structure portion 1201.

For simplification, FIGS. 23 to 25 illustrate only main parts.

Thus, even the cavity 1041 that has a different shape or is disposed on a different location can provide the operational advantage equivalent to the sixth embodiment.

While descriptions have been given of the case where the semiconductor lamination portion has the two-step mesa structure in the above-described embodiments, the semiconductor lamination portion is not limited to the mesa structure, and the semiconductor lamination portion that has any structure may be applied.

WORKING EXAMPLES

The following describes Working Examples of the optical device 1 according to the sixth embodiment of the present invention.

Working Example 1

In Working Example 1, as illustrated in FIG. 24, the cavity 1041 was formed over the entire surface between the mold resin 1050 and the top surface of the protective layer 1040.

First, the optical device having a PIN diode structure was manufactured with the following procedure. That is, an MBE method was employed such that an InSb layer (an n-type semiconductor layer) where Sn was doped by $1.0 \times 10^{19}$ atom/cm$^3$ was grown 1.0 µm thick on a semi-insulating GaAs single crystal semiconductor substrate, an InSb layer (an intrinsic semiconductor layer) where Zn was doped by $1 \times 10^{16}$ atom/cm$^3$ was grown 2.0 µm thick on the n-type semiconductor layer, an $Al_{0.2}In_{0.8}Sb$ layer (a barrier layer) where Zn was doped by $5 \times 10^{18}$ atom/cm$^3$ was grown 0.02 µm thick on the intrinsic semiconductor layer, and further, an InSb layer (a p-type semiconductor layer) where Zn was doped by $5 \times 10^{18}$ atom/cm$^3$ was grown 0.5 µm thick on the barrier layer. This prepared a semiconductor wafer that included the GaAs single crystal semiconductor substrate 1010 and the semiconductor lamination portion 1020 having the photodiode structure in the PIN junction.

A positive photoresist for i-line was applied over a surface of the semiconductor wafer prepared in such way, and a reduced projection type exposure device was used for performing exposure using i-line. Then, development was performed to regularly form a plurality of resist patterns on the surface of the semiconductor lamination portion 1020. Then, a hydrochloric acid-hydrogen peroxide solution was used to perform wet etching, thus forming the mesa structure portion 1201 and the bottom portion 1202 on the semiconductor lamination portion 1020.

On the element having the mesa shape, a $SiO_2$ film was formed as a hard mask, and subsequently, the element isolation was performed with ion milling. Then, a SiN film was formed as the protective layer, and the contact hole was formed by photolithography and dry etching. Then, the electrodes 1031 and 1032 were formed on the top of the mesa structure portion 1201 and the bottom portion 1202 respectively by photolithography and sputtering, thus obtaining the light receiving/emitting element 1100 that included the mesa structure portion 1201 having the area of 420 µm$^2$.

A photosensitivity silicone manufactured by Shin-Etsu Astech Co., Ltd. was applied over the light receiving/emitting element 1100 manufactured through the above process as the protective layer 1040 using a spin coater at a rotation speed of 1000 rpm. Then, baking was performed at 120° C. by a hot plate, and the reduced projection type exposure device was used for performing exposure using i-line. Subsequently, for accelerating photocrosslinking reaction, IPA was used to perform development after post baking which was performed at 120° C. by the hot plate, and finally, thermal curing was performed to form the protective layer 1040.

The wafer manufactured through the above-described previous process was individualized into the chips by dicing, the Au wire was bonded, and the chips were sealed by the epoxy mold resin 1050 manufactured by KYOCERA Chemical Corporation. The mold resin 1050 was cured at the temperature of 175° C. higher than the temperature of the glass transition point of the resin, and the mold resin 1050 was returned into a room temperature immediately after termination of heating.

In the optical device 1 manufactured in such way, the film thickness of the photosensitive silicone as the protective layer 1040 was measured and found to be 80 µm above the mesa structure portion 1201. Furthermore, an SEM was used for observing the cross section of the optical device 1, and it was found that the protective layer 1040 had the shape corresponding to the unevenness of the mesa structure portion 1201 and the bottom portion 1202 of the semiconductor lamination portion 1020. Furthermore, the cavity 1041 having the thickness of 30 µm was observed over the whole between the protective layer 1040 and the mold resin 1050.

Working Example 2

In Working Example 2, as illustrated in FIG. 23, the cavity 1041 was formed only in the region above the bottom portion 1202, and the cavity 1041 was not formed in the region above the mesa structure portion 1201.

In Working Example 2, the thickness of the protective layer 1040 was configured to be 3 µm and the thickness of the cavity 1041 was configured to be approximately 2 µm.

The manufacturing process is similar to Working Example 1 other than the forming condition of the protective layer (the rotation speed of the spin coater was configured to be 1000 rpm when the photosensitive silicone was applied). Then, detail descriptions will be omitted.

Comparative Example

In Comparative Example, the thickness of the protective layer 1040 was configured to be 3 µm, and the cavity 1041 was not formed. In Comparative Example, for realizing the structure without the cavity 1041, a protective layer resin (photosensitive polyimide manufactured by Asahi Kasei Corporation) having good adhesion with the mold resin 1050 was selected.

The forming condition of the protective layer 1040 was changed (the rotation speed of the spin coater was configured to be 3500 rpm when the photosensitive silicone was applied). Other manufacturing processes are similar to Working Example 1. Then, detail descriptions will be omitted.

The following describes the effect of the optical device 1 according to one embodiment of the present invention based on Working Example 1 and Working Example 2, and Comparative Example.

Figure 26:
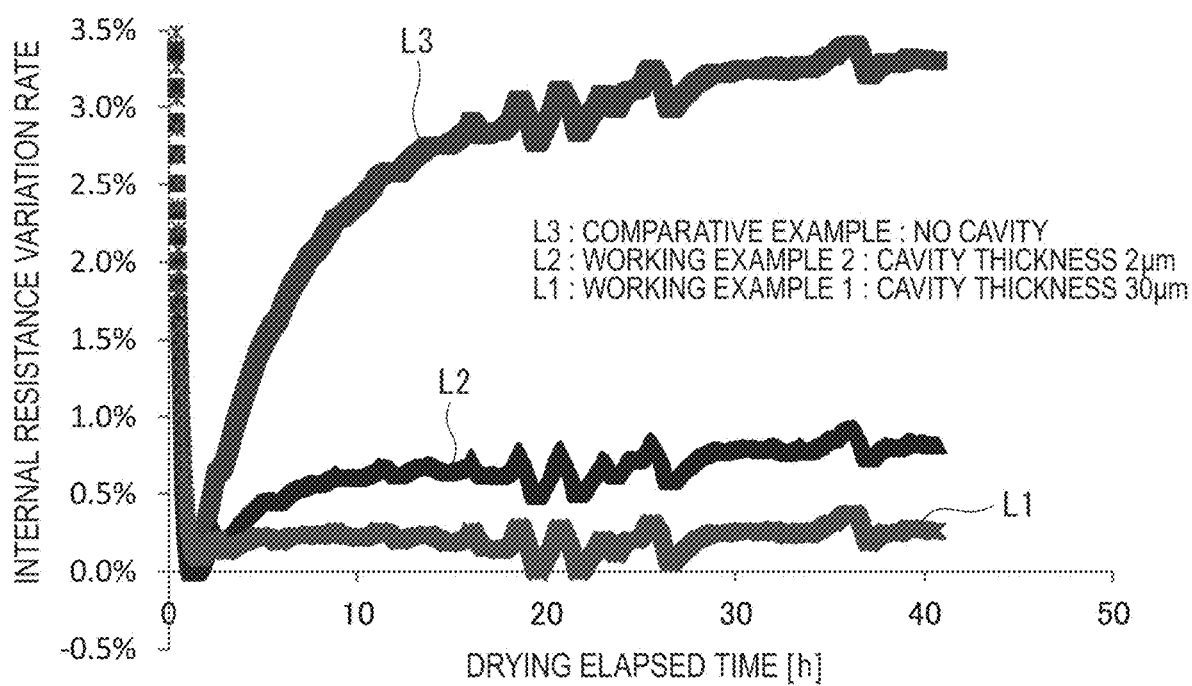
FIG. 26 is a characteristic diagram illustrating a variation of an internal resistance of the optical device according to the sixth embodiment when a temperature and humidity environment is varied.

First, the optical devices of Working Example 1, Working Example 2, and Comparative Example were left in an environment of relative humidity 100% and temperature 25° C. for 24 hours. Next, the optical devices were moved to an environment of humidity 0% and temperature 25° C., and resistance inside the light receiving/emitting element in a process where the optical device was dried was measured. FIG. 26 shows a resistance variation rate to a drying elapsed time relative to a resistance value at a measurement starting time point. In FIG. 26, a characteristic line L1 indicates Working Example 1, a characteristic line L2 indicates Working Example 2, and a characteristic line L3 indicates Comparative Example.

The internal resistance variation rates at 40 hours on the drying elapsed time were, approximately, 3 to 3.5% in the optical device of Comparative Example, 0.5% in Working Example 2, and 0.1% in Working Example 1.

As indicated in FIG. 26, it was found that the relation between the electric property and the stress (for example, due to the state of moisture absorption/drying) of the optical device could be controlled depending on the size of the cavity. A desired correlation is required depending on usage, and the effects of the present invention can be provided even on such usage. That is, in this case, for realizing the desired relation between the electric property and the stress, the number of the cavities, the position, and the shape can be controlled by the conditions in the manufacturing process.

While only the resistances in the optical devices were compared here, sensitivity of a sensor when the sensor is configured including the optical device, or an amount of luminescence of a light emitting device when the light emitting device is configured including the optical device is similarly influenced by the moisture absorption and drying, thus providing similar effects.

While the embodiments of the present invention have been described above, the above-described embodiments merely illustrate devices and methods for embodying the technical idea of the present invention, and the technical idea of the present invention does not specify the materials, the shapes, the structures, the arrangement, and similar factor of the components. The technical idea of the present invention can be variously modified within the technical scope specified in claims described in CLAIMS.

INDUSTRIAL APPLICABILITY

The optical device according to one embodiment of the present invention having properties of high sensitivity, high luminous efficiency, low noise, downsized, high reliability is applicable to a gas sensor, and furthermore, the NDIR gas sensor that employs the optical device according to one embodiment of the present invention is applicable to air monitoring.

REFERENCE SIGNS LIST 1 optical device,
2 light receiving/emitting element,
3 protective layer,
4 wire,
5 terminal portion,
6 mold resin,
11 substrate,
12 active portion,
31, 32 electrode,
61 through hole,
101 lead frame,
102 adhesive sheet,
103 lower mold,
104 upper mold,
111 upper mold,
111a protrusion,
112 sheet,
1010 semiconductor substrate,
1020 semiconductor lamination portion,
1021 first conductivity-type semiconductor layer,
1022 intrinsic semiconductor layer,
1023 second conductivity-type semiconductor layer,
1024 resist,
1031, 1032 electrode,
1033 insulating coating layer,
1040 protective layer,
1041 cavity,
1050 mold resin,
1051 through hole,
1100 light receiving/emitting element,
1201 mesa structure portion,
1202 bottom portion

The invention claimed is:

1. An optical device, comprising:
a substrate;
a semiconductor layer formed on the substrate, the semiconductor layer being configured to receive or emit a light;
a stress relaxation layer having a shape to cover an entire surface of the semiconductor layer;
a resin sealing body configured to seal the stress relaxation layer and the substrate excluding a surface of the substrate on an opposite side of a surface on which the semiconductor layer is formed; and
a cavity formed between the stress relaxation layer and the resin sealing body,
wherein the light enters or is emitted from a side of the substrate,
wherein the light passes through the substrate,
wherein the resin sealing body includes a through hole configured to pass through from a top surface of the resin sealing body to the stress relaxation layer,
wherein the semiconductor layer includes a mesa structure portion, and
wherein a center of the cavity is formed above the mesa structure portion.

2. The optical device according to claim 1, wherein the stress relaxation layer includes a silicone resin.

3. The optical device according to claim 1, wherein the stress relaxation layer includes a photosensitive resin.

4. The optical device according to claim 1, wherein the through hole has a circular shape or a slit shape in top view.

5. The optical device according to claim 1, wherein the through hole is disposed at a proximity of a center of the stress relaxation layer in top view.

6. The optical device according to claim 1, wherein the stress relaxation layer has Young's modulus equal to or less than 70 GPa.

7. The optical device according to claim 1, wherein the stress relaxation layer has a thickness increased toward a center of the substrate.

8. The optical device according to claim 1, wherein the stress relaxation layer has a thickness of 1 µm or more from an uppermost surface of the mesa structure portion, and the cavity has a thickness of 2 µm or more.

9. The optical device according to claim 1, wherein the cavity is formed in a whole region between the stress relaxation layer and the resin sealing body.

10. The optical device according to claim 1, wherein a difference between a linear expansion coefficient of a resin material forming the stress relaxation layer and a linear expansion coefficient of a resin material forming the resin sealing body is 50 ppm or more and 500 ppm or less.

* * * * *